United States Patent
Choi et al.

(10) Patent No.: US 12,243,754 B2
(45) Date of Patent: Mar. 4, 2025

(54) SEMICONDUCTOR DEVICE AND A METHOD OF MANUFACTURING THE SEMICONDUCTOR DEVICE

(71) Applicant: Samsung Electronics Co., Ltd., Suwon-si (KR)

(72) Inventors: Do Young Choi, Hwaseong-si (KR); Sung Min Kim, Incheon (KR); Cheol Kim, Hwaseong-si (KR); Hyo Jin Kim, Seoul (KR); Dae Won Ha, Seoul (KR); Dong Woo Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 579 days.

(21) Appl. No.: 17/517,304

(22) Filed: Nov. 2, 2021

(65) Prior Publication Data

US 2022/0254650 A1  Aug. 11, 2022

(30) Foreign Application Priority Data

Feb. 8, 2021 (KR) .................. 10-2021-0017676

(51) Int. Cl.
*H01L 21/3213* (2006.01)
*H01L 21/308* (2006.01)
*H01L 27/088* (2006.01)
*H01L 27/092* (2006.01)

(52) U.S. Cl.
CPC .... *H01L 21/32139* (2013.01); *H01L 21/3086* (2013.01); *H01L 27/0886* (2013.01); *H01L 27/0924* (2013.01)

(58) Field of Classification Search
CPC ........... H01L 21/32139; H01L 21/3086; H01L 27/0886; H01L 27/0924

See application file for complete search history.

(56) References Cited

U.S. PATENT DOCUMENTS

| | | | |
|---|---|---|---|
| 9,960,077 B1 | 5/2018 | Zang et al. | |
| 10,008,601 B2 | 6/2018 | Cheng et al. | |
| 10,083,874 B1* | 9/2018 | Yu | H01L 29/66545 |
| 10,366,930 B1 | 7/2019 | Xie et al. | |
| 10,658,481 B1 | 5/2020 | Zhang et al. | |
| 10,741,401 B1 | 8/2020 | Xu et al. | |
| 2020/0328207 A1* | 10/2020 | Hong | H01L 29/66545 |
| 2021/0125875 A1* | 4/2021 | Tsai | H01L 21/823481 |
| 2021/0343713 A1* | 11/2021 | Ju | H01L 29/42392 |

* cited by examiner

*Primary Examiner* — Christine A Enad
(74) *Attorney, Agent, or Firm* — Muir Patent Law, PLLC

(57) ABSTRACT

Provided is a semiconductor device. The semiconductor device comprises a first active pattern extending in a first direction on a substrate, a second active pattern which extends in the first direction and is adjacent to the first active pattern in a second direction different from the first direction, a field insulating film placed between the first active pattern and the second active pattern, a first gate structure which crosses the first active pattern, extends in the second direction, and includes a first gate electrode and a first gate spacer, a second gate structure which crosses the second active pattern, extends in the second direction, and includes a second gate electrode and a second gate spacer, a gate separation structure placed on the field insulating film between the first gate structure and the second gate structure.

14 Claims, 41 Drawing Sheets

FIG. 25
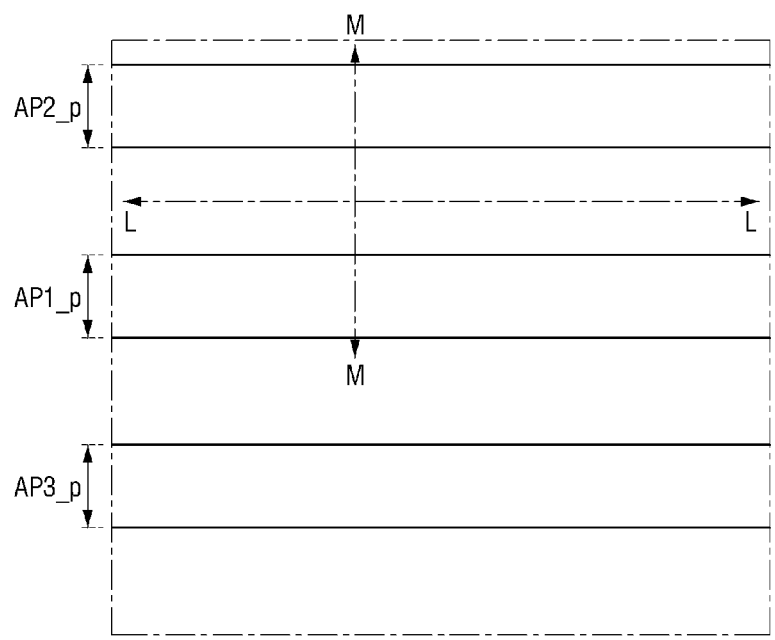
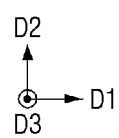

SEMICONDUCTOR DEVICE AND A METHOD OF MANUFACTURING THE SEMICONDUCTOR DEVICE

This application claims priority under 35 U.S.C. § 119 to Korean Patent Application No. 10-2021-0017676 filed on Feb. 8, 2021 in the Korean Intellectual Property Office, the disclosure of which is incorporated herein by reference in its entirety.

BACKGROUND

1. Field of the Invention

The present invention relates to a semiconductor device and a method of manufacturing the same.

2. Description of the Related Art

With high integration of semiconductor devices, it becomes increasingly difficult to achieve transistor performance required by a user. In order to overcome such technical difficulties, various field effect transistor structures have been proposed. For example, a high dielectric film-metal gate structure has been proposed to replace conventional field effect transistors in which silicon oxide and polycrystalline silicon are used as each of a gate insulating layer and a gate electrode material.

As a feature size of the field effect transistor decreases, a gate length and a length of a channel formed below the gate also decrease. Accordingly, various efforts for improving the manufacturing process and structure of an integrated circuit element have been made to improve the operational stability and reliability of transistors, which are important factors that determine the performance of integrated circuits.

SUMMARY

Aspects of the present invention provide a semiconductor device capable of improving operating performance and reliability, by forming a substructure of a gate separation structure in a self-aligned manner and cutting the gate electrode to form a final gate separation structure.

Aspects of the present invention also provide a method of manufacturing a semiconductor device in which a substructure of a gate separation structure is formed in a self-aligned manner and the gate electrode is cut to form a final gate separation structure.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided a semiconductor device comprising a first active pattern extending in a first direction on a substrate, a second active pattern which extends in the first direction and is adjacent to the first active pattern in a second direction different from the first direction, a field insulating film placed between the first active pattern and the second active pattern, a first gate structure which crosses the first active pattern, extends in the second direction, and includes a first gate electrode and a first gate spacer, a second gate structure which crosses the second active pattern, extends in the second direction, and includes a second gate electrode and a second gate spacer, a gate separation structure placed on the field insulating film between the first gate structure and the second gate structure and a first gate insulating film which is placed on a first portion of a first side wall of the gate separation structure, and is not placed on a second portion of the first side wall different from the first portion, wherein a first width in the second direction of the first gate electrode placed between the first active pattern and the gate separation structure at a first height from a top surface of the substrate is the same as a second width in the second direction of the second gate electrode placed between the second active pattern and the gate separation structure at the first height from the top surface of the substrate.

According to another aspect of the present invention, there is provided a semiconductor device comprising a first active pattern extending in a first direction on a substrate, a second active pattern which extends in the first direction and is adjacent to the first active pattern in a second direction different from the first direction, a field insulating film placed between the first active pattern and the second active pattern, a first gate structure which crosses the first active pattern, extends in the second direction, and includes a first gate electrode and a first gate spacer, a second gate structure which crosses the second active pattern, extends in the second direction, and includes a second gate electrode and a second gate spacer, a gate separation structure placed on the field insulating film between the first gate structure and the second gate structure and a first gate insulating film which extends along at least a part of a first side wall of the gate separation structure and an upper surface of the field insulating film, wherein a width in the second direction of the first gate electrode placed between the first active pattern and the gate separation structure at a first height from a top surface of the substrate is the same as a width in the second direction of the second gate electrode placed between the second active pattern and the gate separation structure at the first height, and a height of the first gate insulating film is between a height of the first gate electrode and a height of an uppermost surface of the first active pattern from the top surface of the substrate.

According to still another aspect of the present invention, there is provided a method of manufacturing a semiconductor device comprising forming a first preliminary active pattern structure and a second preliminary active pattern structure on a substrate, the first preliminary active pattern structure extending in a first direction, the second preliminary active pattern structure extending in the first direction and being adjacent to the first preliminary active pattern structure in a second direction different from the first direction, forming a field insulating film placed between the first preliminary active pattern structure and the second preliminary active pattern structure, forming a dummy conductive material film conformally on the field insulating film and the first and second preliminary active pattern structures, forming a mask pattern on an uppermost surface of the dummy conductive material film, etching a part of a center of the field insulating film using the mask pattern to form a first recess, forming a sacrificial film in the first recess, forming a dummy electrode which covers the sacrificial film and the dummy conductive material film, removing the sacrificial film and forming a dam structure including an insulating material in place of the removed sacrificial film, removing the dummy electrode which covers the dam structure to sequentially form a gate insulating film and a gate electrode which cover first and second active patterns formed from the dam structure and the first and second preliminary active pattern structures, removing a part of the gate electrode which vertically overlaps the dam structure to form a first trench, and separating the gate electrode into a first gate electrode covering the first active pattern and a second gate electrode covering the second active pattern through the first trench and forming a gate separation filling film in the first trench.

BRIEF DESCRIPTION OF THE DRAWINGS

The above and other aspects and features of the present invention will become more apparent by describing in detail exemplary embodiments thereof referring to the attached drawings, in which:

FIGS. 8 to 15 are diagrams for explaining a semiconductor device according to some embodiments;

FIGS. 25 to 40 are intermediate stage diagrams for explaining the method of manufacturing the semiconductor device according to some embodiments.

DETAILED DESCRIPTION OF THE EMBODIMENTS

Figure 1:
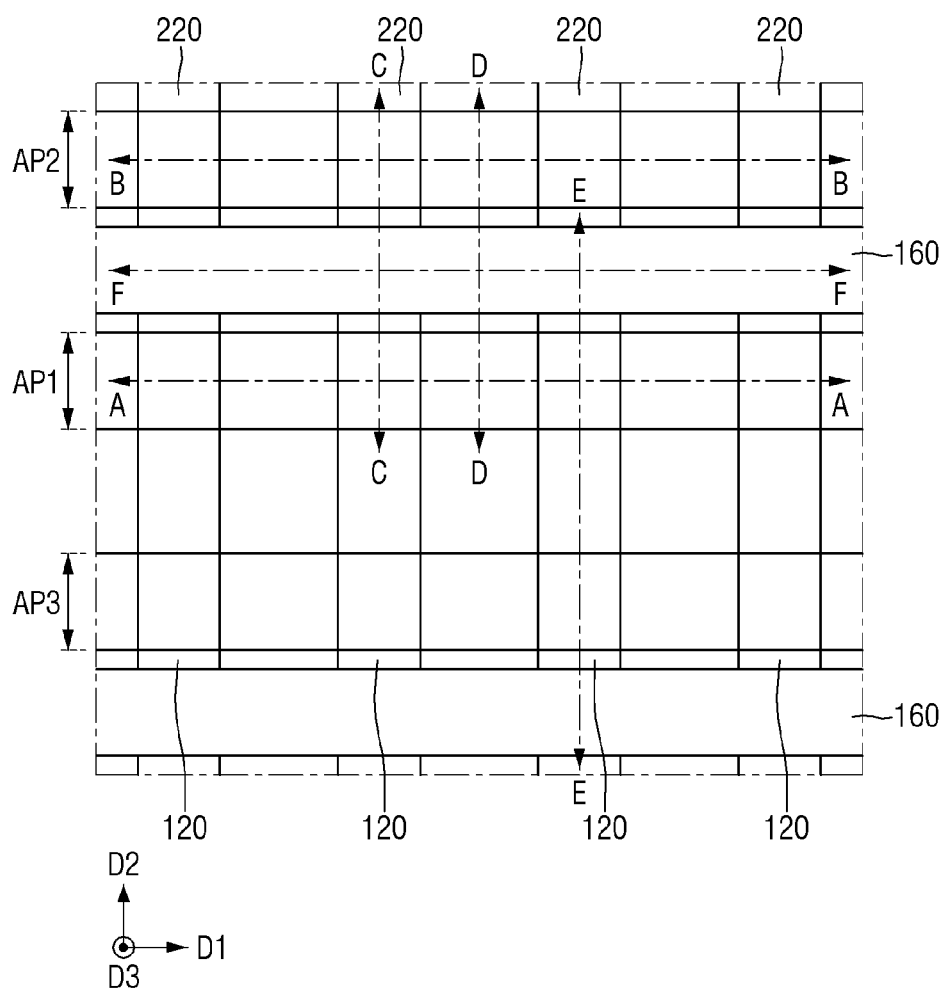
FIG. 1 is a layout diagram for explaining a semiconductor device according to some embodiments.

Hereinafter, embodiments according to the technical idea of the present invention will be described referring to the accompanying drawings. In the description of FIGS. 1 to 40, the same reference numerals are used for substantially the same components, and repeated description of the components will not be provided. Also, similar reference numerals are used for similar components throughout various drawings of the present invention.

Although the drawings of a semiconductor device according to some embodiments show a fin-type transistor (Fin-FET) including a channel region of a fin-type pattern shape, a planar transistor, a transistor including a nanowire or a nanosheet, and a MBCFET™ (Multi-Bridge Channel Field Effect Transistor) as examples, the embodiments are not limited thereto. For example, the semiconductor device according to some embodiments may include a tunneling FET or a three-dimensional (3D) transistor. In certain embodiments, the technical idea of the present invention may be applied to a transistor based on two-dimensional material (2D material based FETs) and a heterostructure thereof.

Further, the semiconductor device according to some embodiments may also include a bipolar junction transistor, a laterally diffused metal oxide semiconductor (LDMOS), or the like.

Figure 2:
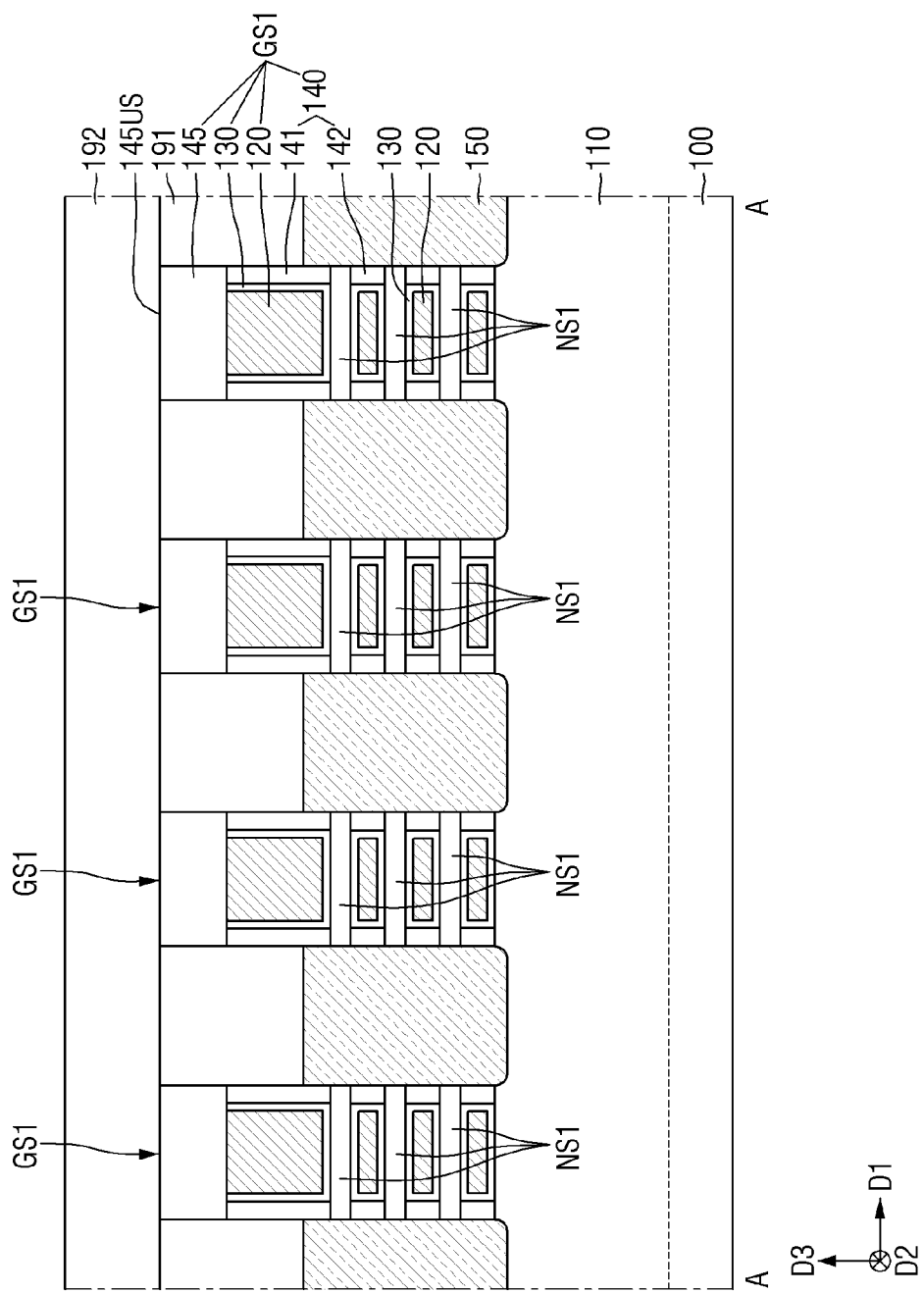
FIGS. 2 and 3 are exemplary cross-sectional views taken along A-A of FIG. 1.
Figure 3:
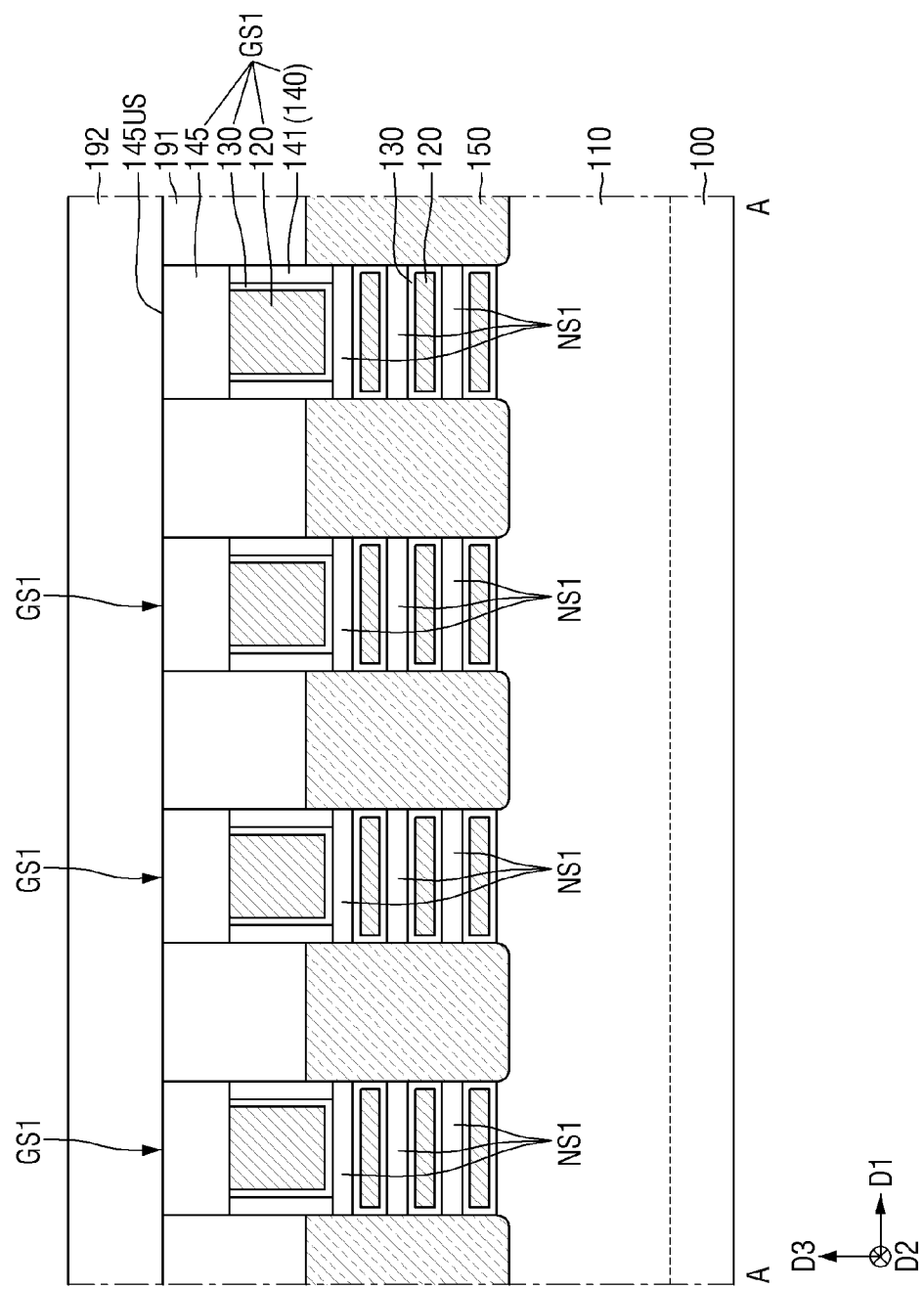

FIG. 1 is a layout diagram for explaining the semiconductor device according to some embodiments. FIGS. 2 and 3 are exemplary cross-sectional views taken along A-A of FIG. 1. FIGS. 4 to 8 are cross-sectional views taken along B-B, C-C, D-D, E-E, and F-F of FIG. 1, respectively. Referring to FIGS. 1 to 8, the semiconductor device according to some embodiments may include a first active pattern AP1, a second active pattern AP2, a third active pattern AP3, a plurality of first gate electrodes 120, a plurality of second gate electrodes 220, and a first gate separation structure 160.

The substrate 100 may be a silicon substrate or an SOI (silicon-on-insulator). In contrast, although the substrate 100 may be a silicon substrate or may include, but is not limited to, silicon germanium, SGOI (silicon germanium on insulator), indium antimonide, lead tellurium compounds, indium arsenic, indium phosphide, gallium arsenide or gallium antimonide.

The first active pattern AP1, the second active pattern AP2, and the third active pattern AP3 may be placed on the substrate 100. The first active pattern AP1, the second active pattern AP2, and the third active pattern AP3 may each extend lengthwise in a first direction D1.

An item, layer, or portion of an item or layer described as extending "lengthwise" in a particular direction has a length in the particular direction and a width perpendicular to that direction, where the length is greater than the width.

The first active pattern AP1, the second active pattern AP2, and the third active pattern AP3 may be placed apart from each other in a second direction D2. For example, the first direction D1 is a direction that intersects the second direction D2. For example, the first direction D1 may be perpendicular to the second direction D2. The first active pattern AP1 may be placed between the second active pattern AP2 and the third active pattern AP3. The first active pattern AP1 is adjacent to the second active pattern AP2 and the third active pattern AP3 in the second direction D2.

The first active pattern AP1 and the third active pattern AP3 may be placed between first gate separation structures 160 which extend lengthwise in the first direction D1. The first gate separation structure 160 may be placed between the first active pattern AP1 and the second active pattern AP2. The features of the first gate separation structure 160 will be described below.

For example, the first active pattern AP1 and the third active pattern AP3 may be an active region included in a single standard cell. As an example, the first active pattern AP1 may be a region in which PMOS is formed, and the third active pattern AP3 may be a region in which NMOS is formed. As another example, the first active pattern AP1 may be a region in which NMOS is formed and the third active pattern AP3 may be a region in which PMOS is formed.

For example, the second active pattern AP2 may be a region in which a transistor of the same conductivity type as that of the first active pattern AP1 is formed. As an example, when the first active pattern AP1 is a region in which PMOS is formed, the second active pattern AP2 may be a region in which PMOS is formed. As another example, when the first active pattern AP1 is a region in which NMOS is formed, the second active pattern AP2 may be a region in which NMOS is formed.

The first active pattern AP1 may include a first lower pattern 110, and a plurality of first sheet patterns NS1. The second active pattern AP2 may include a second lower pattern 210 and a plurality of second sheet patterns NS2. The third active pattern AP3 may include a third lower pattern 310 and a plurality of third sheet patterns NS3.

The first lower pattern 110, the second lower pattern 210, and the third lower pattern 310 may each protrude from the substrate 100. The first lower pattern 110, the second lower pattern 210, and the third lower pattern 310 may each extend lengthwise in the first direction D1.

The first lower pattern 110 may be spaced apart from the second lower pattern 210 and the third lower pattern 310 in the second direction D2. Each of the first lower pattern 110, the second lower pattern 210, and the third lower pattern 310 may be separated by a fin trench FT extending in the first direction D1.

A plurality of first sheet patterns NS1 may be placed on the first lower pattern 110. The plurality of first sheet patterns NS1 may be spaced apart from the first lower pattern 110 in a third direction D3. The plurality of first sheet patterns NS1 spaced apart from each other in the third direction D3 may be arranged in the first direction D1 along an upper surface of the first lower pattern 110, e.g., as shown in FIGS. 2 and 3. Although not shown in the drawings, the description of the third sheet patterns NS3 may be substantially the same as the description of the first sheet patterns NS1. For example, the third sheet patterns NS3 may have the same structure/shape as the first sheet patterns NS1.

Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The plurality of second sheet patterns NS2 may be placed on the second lower pattern 210. The plurality of second sheet patterns NS2 may be spaced apart from the second lower pattern 210 in the third direction D3. A plurality of second sheet patterns NS2 spaced apart from each other in the third direction D3 may be arranged in the first direction D1 along the upper surface of the second lower pattern 210.

Each first sheet pattern NS1 may include a plurality of nanosheets sequentially placed in the third direction D3. Each second sheet pattern NS2 may include a plurality of nanosheets sequentially placed in the third direction D3. Each third sheet pattern NS3 may include a plurality of nanosheets sequentially placed in the third direction D3. Here, the third direction D3 may be a direction that intersects the first direction D1 and the second direction D2. For example, the third direction D3 may be perpendicular to the first direction D1 and the second direction D2. For example, the third direction D3 may be a thickness direction of the substrate 100.

In FIGS. 2, 3, 4, 5A and 7, although each of the three first sheet patterns NS1, the three second sheet patterns NS2 and the three third sheet patterns NS3 is shown as being placed in the third direction D3, this is merely for convenience of explanation, and the embodiment is not limited thereto.

Each of the first lower pattern 110, the second lower pattern 210, and the third lower pattern 310 may be formed by etching a part of the substrate 100, and may include an epitaxy layer that is grown from the substrate 100. Each of the first lower pattern 110, the second lower pattern 210, and the third lower pattern 310 may include silicon or germanium, which is an elemental semiconductor material. Further, each of the first lower pattern 110, the second lower pattern 210 and the third lower pattern 310 may include a compound semiconductor, and may include, for example, a group IV-IV compound semiconductor or a group III-V compound semiconductor.

The group IV-IV compound semiconductor may include, for example, a binary compound or a ternary compound containing at least two or more of carbon (C), silicon (Si), germanium (Ge), and tin (Sn), or a compound obtained by doping these elements with a group IV element.

The group III-V compound semiconductor may be, for example, at least one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element.

Each first sheet pattern NS1 may include one of silicon or germanium which is an elemental semiconductor material, a group IV-IV compound semiconductor or a group III-V compound semiconductor. Each second sheet pattern NS2 may include one of silicon or germanium which is an elemental semiconductor material, a group IV-IV compound semiconductor or a group III-V compound semiconductor. Each third sheet pattern NS3 may include one of silicon or germanium which is an elemental semiconductor material, a group IV-IV compound semiconductor or a group III-V compound semiconductor.

For example, a width of the first sheet pattern NS1 in the second direction D2 may increase or decrease in proportion to a width of the first lower pattern 110 in the second direction D2.

A field insulating film 105 may be formed on the substrate 100. The field insulating film 105 may fill at least a part of the fin trench FT. The field insulating film 105 may be placed between the first active pattern AP1 and the second active pattern AP2, and between the first active pattern AP1 and the third active pattern AP3.

The field insulating film 105 may cover the side wall of the first lower pattern 110, the side wall of the second lower pattern 210, and the side wall of the third lower pattern 310. Unlike that shown in the drawings, a part of the first lower pattern 110, a part of the second lower pattern 210, and a part of the third lower pattern 310 may protrude in the third direction D3 from an upper surface 105US of the field insulating film 105.

Each first sheet pattern NS1, each second sheet pattern NS2, and each third sheet pattern NS3 are placed higher than the upper surface 105US of the field insulating film 105. The field insulating film 105 may include or be formed of, for example, an oxide film, a nitride film, an oxynitride film or a combination film thereof.

A plurality of first gate structures GS1 may be placed on the substrate 100. The plurality of first gate structures GS1 may be placed between the first gate separation structures 160 which extend lengthwise in the first direction D1. Each first gate structure GS1 may extend lengthwise in the second direction D2. Adjacent first gate structures GS1 may be spaced apart from each other in the first direction D1.

The first gate structure GS1 may be placed on the first active pattern AP1 and the third active pattern AP3. The first gate structure GS1 may intersect the first active pattern AP1 and the third active pattern AP3, e.g., in a plan view. For example, each first gate structure GS1 may cross the first active pattern AP1 and the third active pattern AP3.

The plurality of second gate structures GS2 may be placed on the substrate 100. Each second gate structure GS2 may extend lengthwise in the second direction D2. Adjacent second gate structures GS2 may be spaced apart from each other in the first direction D1. A first gate structure GS1 and A second gate structure GS2 corresponding to each other may face each other with the first gate separation structure 160 interposed therebetween. For example, the first gate structure GS1 and the second gate structure GS2 corresponding to each other may be arranged in the second direction D2. For example, side surfaces of the first gate structure GS1 and the second gate structure GS2 corresponding to each other may be coplanar.

The second gate structure GS2 may be placed on the second active pattern AP2. The second gate structure GS2 may intersect the second active pattern AP2, e.g., in a plan view. For example, each second gate structure GS2 may cross the second active pattern AP2.

The first gate structure GS1 may include, for example, a first gate electrode 120, a first gate insulating film 130, a first gate spacer 140 and a first gate capping pattern 145. The second gate structure GS2 may include, for example, a second gate electrode 220, a second gate insulating film 230, a second gate spacer 240, and a second gate capping pattern 245.

The first gate electrode 120 may be formed on the first lower pattern 110 and the third lower pattern 310. The first gate electrode 120 may intersect the first lower pattern 110 and the third lower pattern 310, e.g., in a plan view. For example, the first gate electrode 120 may cross the first lower pattern 110 and the third lower pattern 310. The first gate electrode 120 may wrap/surround the first sheet patterns NS1 and the third sheet patterns NS3.

The second gate electrode 220 may be formed on the second lower pattern 210. The second gate electrode 220 may intersect the second lower pattern 210, e.g., in a plan view. For example, the second gate electrode 220 may cross the second lower pattern 210. The second gate electrode 220 may wrap/surround the second sheet patterns NS2.

Although the first gate electrode 120 and the second gate electrode 220 are shown as a single metal layer in the drawings, they may be implemented as a plurality of metal layers, without being limited thereto.

Each of the first gate electrode 120 and the second gate electrode 220 may include or be formed of at least one of a metal, a metal alloy, a conductive metal nitride, a metal silicide, a doped semiconductor material, a conductive metal oxide and a conductive metal oxynitride. The first gate electrode 120 and the second gate electrode 220 may include, but are not limited to, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and combinations thereof. The conductive metal oxide and the conductive metal oxynitride may include, but are not limited to, an oxidized form of the above-mentioned materials.

Although four first gate electrodes 120 and four second gate electrodes 220 are shown in the drawings, this is merely for convenience of explanation, and the number thereof is not limited thereto. The numbers of the first gate electrodes 120 and the second gate electrodes 220 may be larger or smaller than four.

An upper surface 120US of the first gate electrode 120 and an upper surface 220US of the second gate electrode 220 may have the same height from a top surface of the substrate 100. For example, the top surface of the substrate 100 may correspond to a bottom surface of the field insulating film 105, a bottom of the first lower pattern 110 and/or a bottom of the second lower pattern 210. For example, a height in this description may refer to a distance in the third direction D3 from a horizontal plane/surface or from a reference point. For example, since the upper surface of the region adjacent to the first gate separation structure 160 has a flat/planar shape, a height h3 of the upper surface 120US of the first gate electrode 120 and the upper surface 220US of the second gate electrode 220 may be the same. For example, the upper surface 120US of the first gate electrode 120 and the upper surface 220US of the second gate electrode 220 may be coplanar.

At the same height from the top surface of the substrate 100, a width W11, in the second direction D2, of the first gate electrode 120 placed between the first sheet pattern NS1 and the gate separation structure 160 is the same as a width W21, in the second direction D2, of the second gate electrode 220 placed between the second sheet pattern NS2 and the gate separation structure 160. This structure is a structure formed by a process according to an embodiment illustrated in FIG. 29, which will be described below.

The first gate insulating film 130 may extend along the upper surface 105US of the field insulating film 105, the upper surface of the first lower pattern 110, the upper surface of the third lower pattern 310, and the side wall of the first gate separation structure 160. The first gate insulating film 130 may wrap/surround the first sheet patterns NS1 and the third sheet patterns NS3. The first gate insulating film 130 may be placed along the periphery of the first sheet patterns NS1 and the periphery of the third sheet patterns NS3. The first gate electrode 120 is placed on the first gate insulating film 130. For example, the first gate insulating film 130 may contact a bottom surface and side surfaces of the first gate electrode 120.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The first gate insulating film 130 may be placed and/or contact only on the upper surface of a part of the side wall of the first gate separation structure 160, and may not be placed on a part of the side wall. For example, the first gate insulating film 130 may be placed on and/or contact a side wall of a first dam structure 163 to be described below, and may not be placed on a side wall of a gate separation filling film 162.

A height h1 of the first gate insulating film 130 may be placed between a height h2 of uppermost surfaces of the first sheet patterns NS1 and the second sheet patterns NS2, and a height h3 of upper surfaces of the first gate electrode 120 and the second gate electrode 220. For example, the height of the first gate insulating film 130 is higher than the height h2 of the uppermost surfaces of the first sheet patterns NS1 and the second sheet patterns NS2, and is lower than the height h3 of the upper surfaces of the first gate electrode 120 and the second gate electrode 220.

The second gate insulating film 230 may extend along the side wall of the first gate separation structure 160, the upper surface 105US of the field insulating film, and the upper surface of the second lower pattern 210. The second gate insulating film 230 may wrap/surround the second sheet patterns NS2. The second gate insulating film 230 may be placed along the periphery of the second sheet patterns NS2. The second gate electrode 220 may be placed on the second gate insulating film 230. For example, a bottom surface and side surfaces of the second gate electrode 220 may contact the second gate insulating film 230.

The second gate insulating film 230 may be placed only on the upper surface of a part of the side wall of the first gate separation structure 160, and may not be placed on a part of the side wall. For example, the second gate insulating film 230 may be placed on a side wall of a first dam structure 163 to be described below, and may not be placed on a side wall of a gate separation filling film 162.

The height h1 of the first gate insulating film 230 and the second gate insulating film 230 may be the same.

The first gate insulating film 130 and the second gate insulating film 230 may be formed of or may include at least one of silicon oxide, silicon oxynitride, silicon nitride or a high dielectric constant material having a higher dielectric constant than silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The semiconductor device according to some other embodiments may include an NC (Negative Capacitance) FET that uses a negative capacitor. For example, the first and second gate insulating films 130 and 230 may include a ferroelectric material film having ferroelectric properties, and a paraelectric material film having the paraelectric properties.

The ferroelectric material film may have a negative capacitance, and the paraelectric material film may have a positive capacitance. For example, when two or more capacitors are connected in series, and the capacitance of each capacitor has a positive value, the entire capacitance decreases from the capacitance of each individual capacitor. On the other hand, when at least one of the capacitances of two or more capacitors connected in series has a negative value, the entire capacitance may be greater than an absolute value of each individual capacitance, while having a positive value.

When the ferroelectric material film having the negative capacitance and the paraelectric material film having the positive capacitance are connected in series, the entire capacitance values of the ferroelectric material film and the paraelectric material film connected in series may increase. Taking advantage of the increased overall capacitance value, a transistor including the ferroelectric material film may have a subthreshold swing (SS) below 60 mV/decade at room temperature.

The ferroelectric material film may have ferroelectric properties. The ferroelectric material film may include or be formed of, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a dopant. For example, the dopant may include or may be at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include or may be, for example, at least one of gadolinium (Gd), silicon (Si), zirconium (Zr), aluminum (Al), and yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have paraelectric properties. The paraelectric material film may include or be formed of at least one of, for example, a silicon oxide and a metal oxide having a high dielectric constant. The metal oxide included in the paraelectric material film may include or may be, but is not limited to, for example, at least one of hafnium oxide, zirconium oxide, and aluminum oxide.

The ferroelectric material film and the paraelectric material film may include the same material. The ferroelectric material film has the ferroelectric properties, but the paraelectric material film may not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. A thickness of the ferroelectric material film may be, but is not limited to, for example, 0.5 to 10 nm. Since a critical thickness that exhibits the ferroelectric properties may vary for each ferroelectric material, the thickness of the ferroelectric material film may vary depending on the ferroelectric material.

As an example, the first and second gate insulating films 130 and 230 may include a single ferroelectric material film. As another example, the first and second gate insulating films 130 and 230 may include a plurality of ferroelectric material films spaced apart from each other. The first and second gate insulating films 130 and 230 may have a stacked film structure in which a plurality of ferroelectric material films and a plurality of paraelectric material films are alternately stacked.

The first gate spacer 140 may be placed on the side wall of the first gate electrode 120. As an example, in FIG. 2, the first gate spacer 140 placed on the first lower pattern 110 may include a first outer spacer 141 and a first inner spacer 142. The first inner spacer 142 may be placed between the first sheet patterns NS1 adjacent to each other in the third direction D3. As another example, in FIG. 3, the first gate spacer 140 placed on the first lower pattern 110 does not include the first inner spacer 142, and may include only the first outer spacer 141.

The second gate spacer 240 may be placed on the side wall of the second gate electrode 120. Since the first active pattern AP1 and the second active pattern AP2 may be transistor formation region of the same conductivity type, the second gate spacer 240 placed on the second lower pattern 210 may have the same structure as the first gate spacer 140 placed on the first lower pattern 110. As an example, when the first gate spacer 140 placed on the first lower pattern 110 includes the first outer spacer 141 and the first inner spacer 142, the second gate spacer 240 disposed on the second lower pattern 210 may include a second outer spacer 241 and a second inner spacer 242. As another example, when the first gate spacer 140 placed on the first lower pattern 110 does not include the first inner spacer 142, the second gate spacer 240 placed on the second lower pattern 210 may also not include the second inner spacer 242.

Although not shown in the drawings, as an example, the first gate spacer 140 disposed on the third lower pattern 310 may include a first outer spacer 141 and a first inner spacer 142. As another example, the first gate spacer 140 placed on the third lower pattern 310 may not include the first inner spacer 142 and may include only the first outer spacer 141.

Each of the outer spacers 141 and 241 and the inner spacers 142 and 242 may include or be formed of, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof.

The first gate capping pattern 145 may be placed on the first gate electrode 120 and the first gate spacer 140. An upper surface 145US of the first gate capping pattern may be placed on the same plane as the upper surface of a first interlayer insulating film 191. Unlike that shown in the FIG. 2, the first gate capping pattern 145 may be placed between the first gate spacers 140.

The second gate capping pattern 245 may be placed on the second gate electrode 220 and the second gate spacer 240. An upper surface 245US of the second gate capping pattern may be placed on the same plane as the upper surface of the first interlayer insulating film 191. Unlike that shown in FIG. 4, the second gate capping pattern 245 may be placed between the second gate spacers 240.

The first gate capping pattern 145 and the second gate capping pattern 245 may include or be formed of, for example, at least one of silicon nitride (SiN), silicon oxynitride (SiON), silicon carbonitride (SiCN), silicon oxycarbonitride (SiOCN), and combinations thereof. The first gate capping pattern 145 and the second gate capping pattern 245 may include or be formed of materials having etching selectivity to the first interlayer insulating film 191.

A plurality of first source/drain patterns 150 may be placed on the first lower pattern 110. The plurality of first source/drain patterns 150 may be placed between the first gate electrodes 120 adjacent to each other in the first direction D1. Each first source/drain pattern 150 may be connected to the first sheet pattern NS1 adjacent in the first direction D1.

A plurality of second source/drain patterns 250 may be placed on the second lower pattern 210. The plurality of second source/drain patterns 250 may be placed between the second gate electrodes 220 adjacent to each other in the first direction D1. Each second source/drain pattern 250 may be connected to the second sheet pattern NS2 adjacent in the first direction D1.

The first source/drain pattern 150 may be included in a source/drain of a transistor that uses the first sheet pattern NS1 as a channel region. The second source/drain pattern 250 may be included in a source/drain of a transistor that uses the second sheet pattern NS2 as a channel region.

Although not shown in the drawings, a source/drain contact may be placed on the first source/drain pattern 150 and the second source/drain pattern 250. Further, a metal silicide film may be further placed between the source/drain contact and the source/drain patterns 150 and 250.

Figure 6:
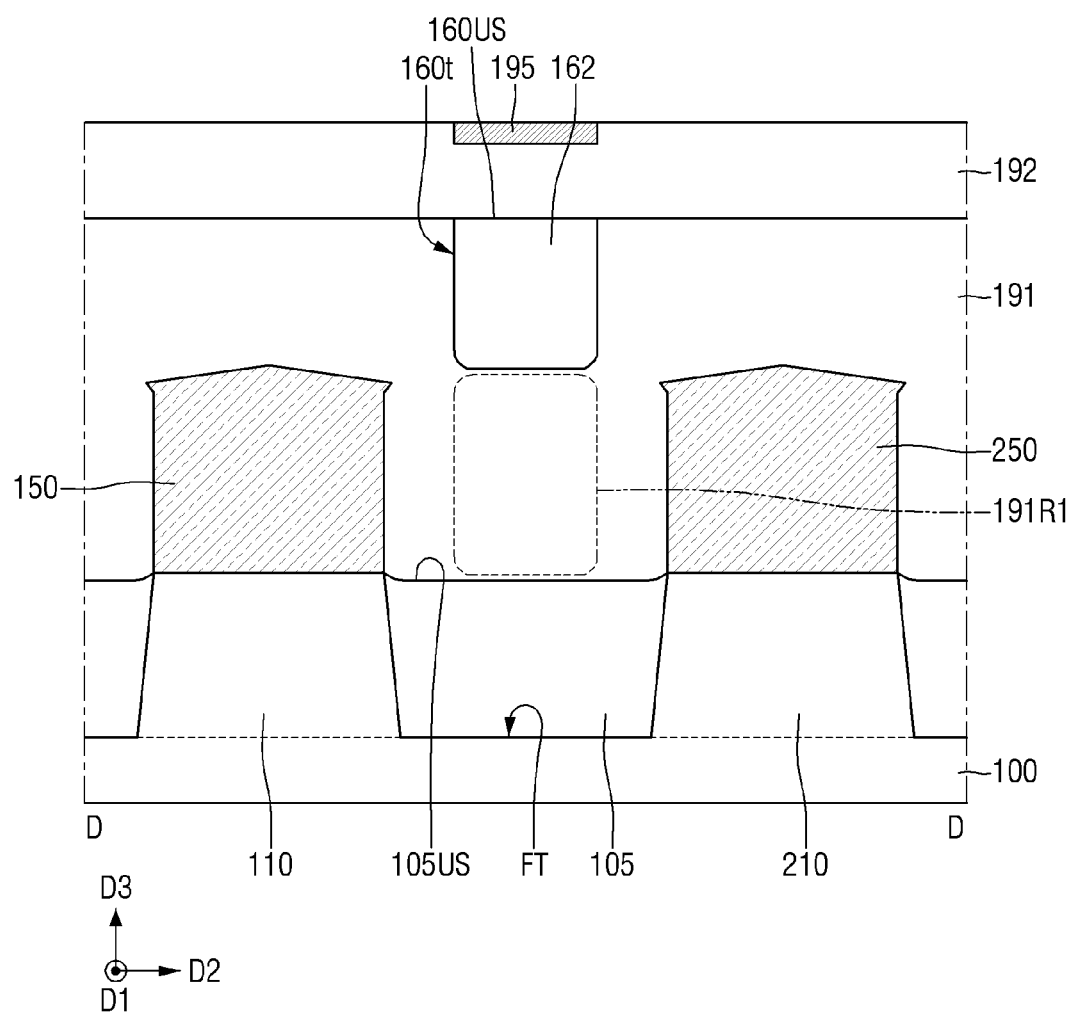
Figure 7:
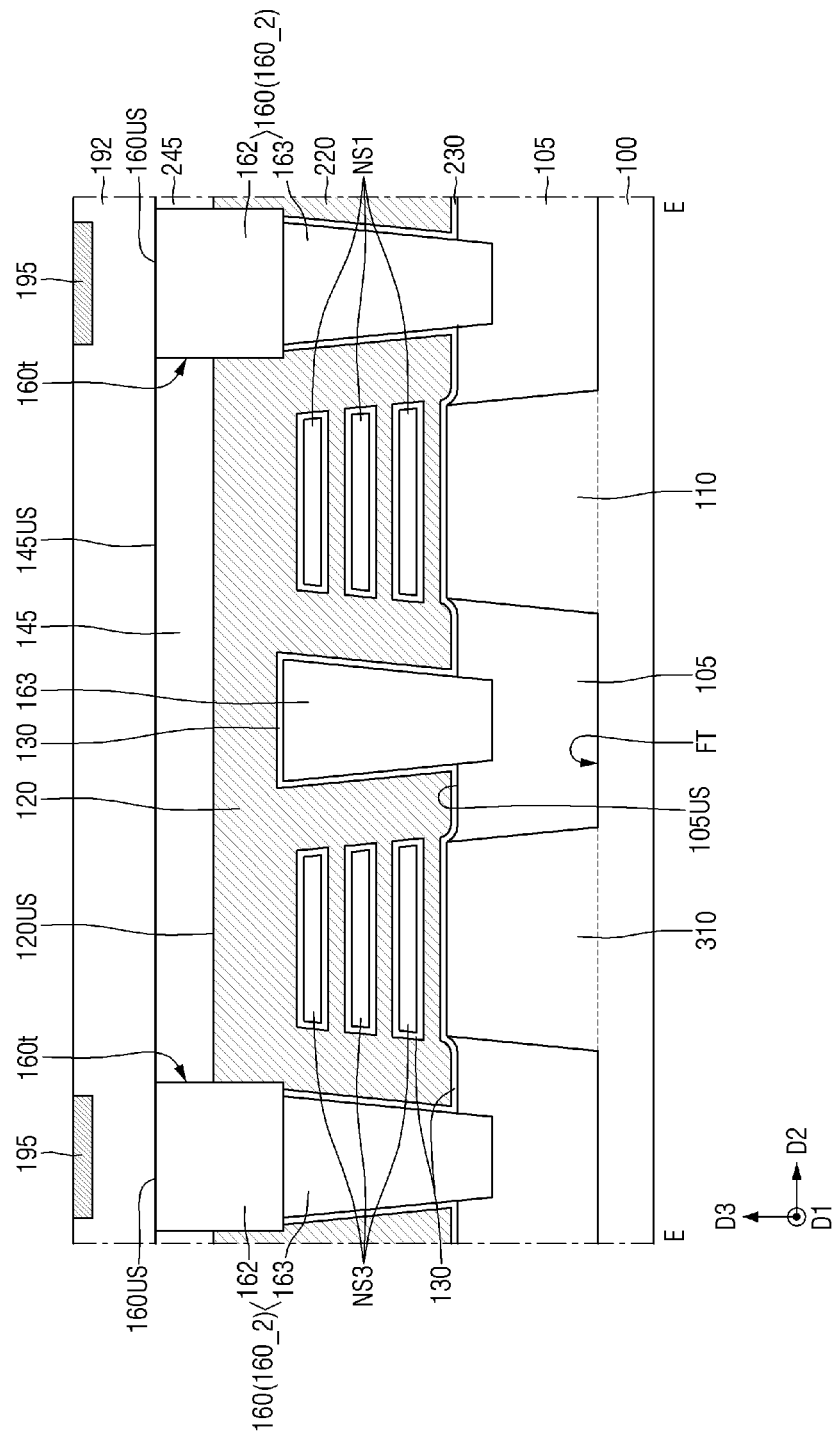

Although the first source/drain pattern 150 and the second source/drain pattern 250 are shown to have a cross section similar to an arrow, e.g., in FIG. 6, the embodiment is not limited thereto.

The first interlayer insulating film 191 may be placed on the field insulating film 105. The first interlayer insulating film 191 may cover the side wall of the first gate structure GS1 and the side wall of the second gate structure GS2. The first interlayer insulating film 191 may be formed on the first source/drain pattern 150 and the second source/drain pattern 250. The first interlayer insulating film 191 may include or be formed of, for example, a silicon oxide or oxide-based insulating material.

The first gate separation structure 160 may be placed on the substrate 100. The first gate separation structure 160 may be placed on the field insulating film 105 between the first active pattern AP1 and the second active pattern AP2. The first gate separation structure 160 may be placed along the first direction D1.

The first gate separation structures 160 may be spaced apart from each other in the second direction D2. The first active pattern AP1 and the second active pattern AP2 may be placed between the first gate separation structures 160 adjacent to each other in the second direction D2. The first gate structure GS1 may be placed between the first gate separation structures 160 adjacent to each other in the second direction D2.

In the semiconductor device according to some embodiments, the first gate separation structure 160 may be placed along a boundary of a standard cell. For example, the first gate separation structure 160 may be a standard cell separation structure.

The first gate separation structure 160 may separate the gate electrodes adjacent to each other in the second direction D2. The first gate structure GS1 and the second gate structure GS2 may be separated by the first gate separation structure 160. For example, the first gate electrode 120 and the second gate electrode 220 may be separated by the first gate separation structure 160.

For example, when the first gate electrode 120 and the second gate electrode 220 include an end that includes a single side wall, the first gate separation structure 160 may be placed between the end of the first gate electrode 120 and the end of the second gate electrode 220. For example, the first gate separation structure 160 may be interposed between side walls of the first and second gate electrodes 120 and 220 facing each other.

The first gate separation structure 160 may be placed on the field insulating film 105 between the first gate structure GS1 and the second gate structure GS2 arranged in the second direction D2. The upper surface 160US of the first gate separation structure may be placed on the same plane as the upper surface 145US of the first gate capping pattern 145 and the upper surface 245US of the second gate capping pattern 245.

The first gate separation structure 160 may be placed in the first interlayer insulating film 191 on the field insulating film 105. The upper surface 160US of the first gate separation structure may be placed on the same plane as the upper surface of the first interlayer insulating film 191.

Referring to FIG. 6, a first recess insulating film 191R1 of the first interlayer insulating film 191 may be placed between the first gate separation structure 160 and the field insulating film 105. The first recess insulating film 191R1 may be a portion of the first interlayer insulating film 191 that overlaps the first gate separation structure 160 in the third direction D3.

The first gate separation structure 160 may be placed inside the first gate separation trench 160t defined by the first interlayer insulating film 191 and the field insulating film 105. The first gate separation structure 160 may fill the first gate separation trench 160t. The first gate separation trench 160t separates the first gate structure GS1 and the second gate structure GS2.

Figure 5A:
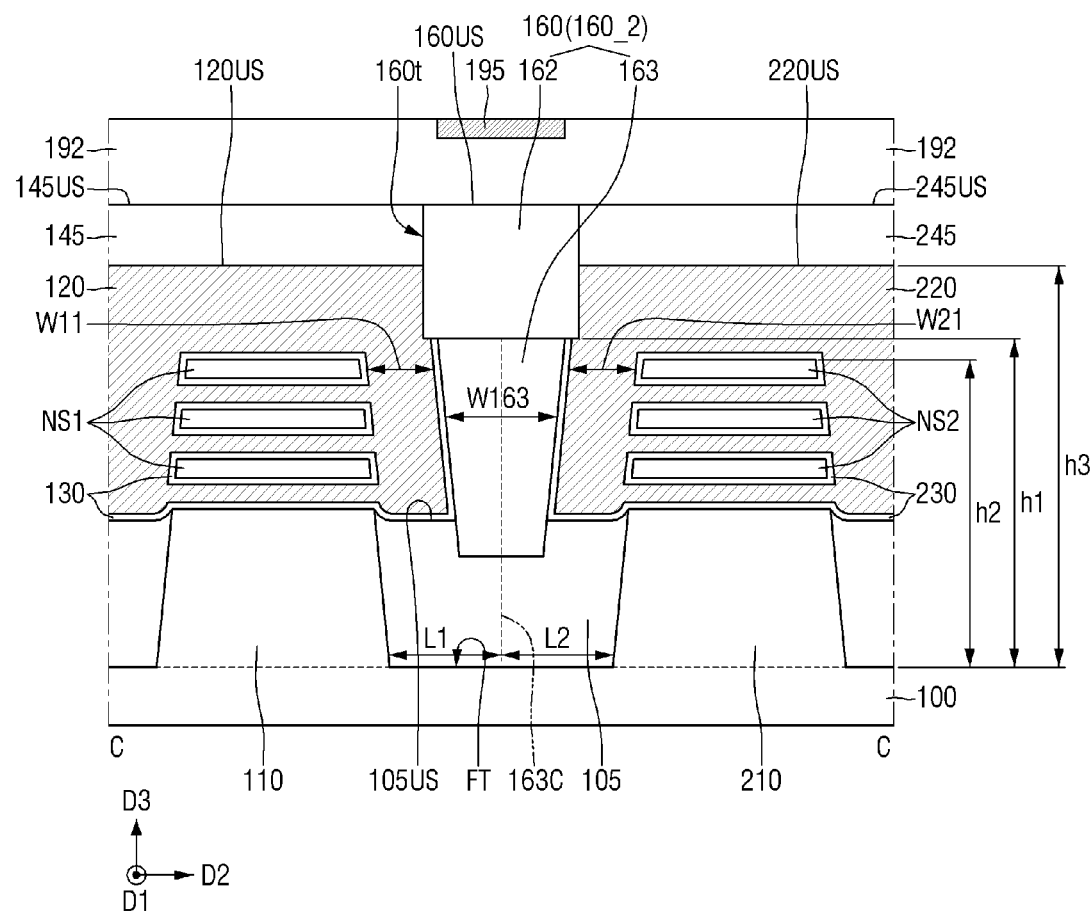
Figure 5B:
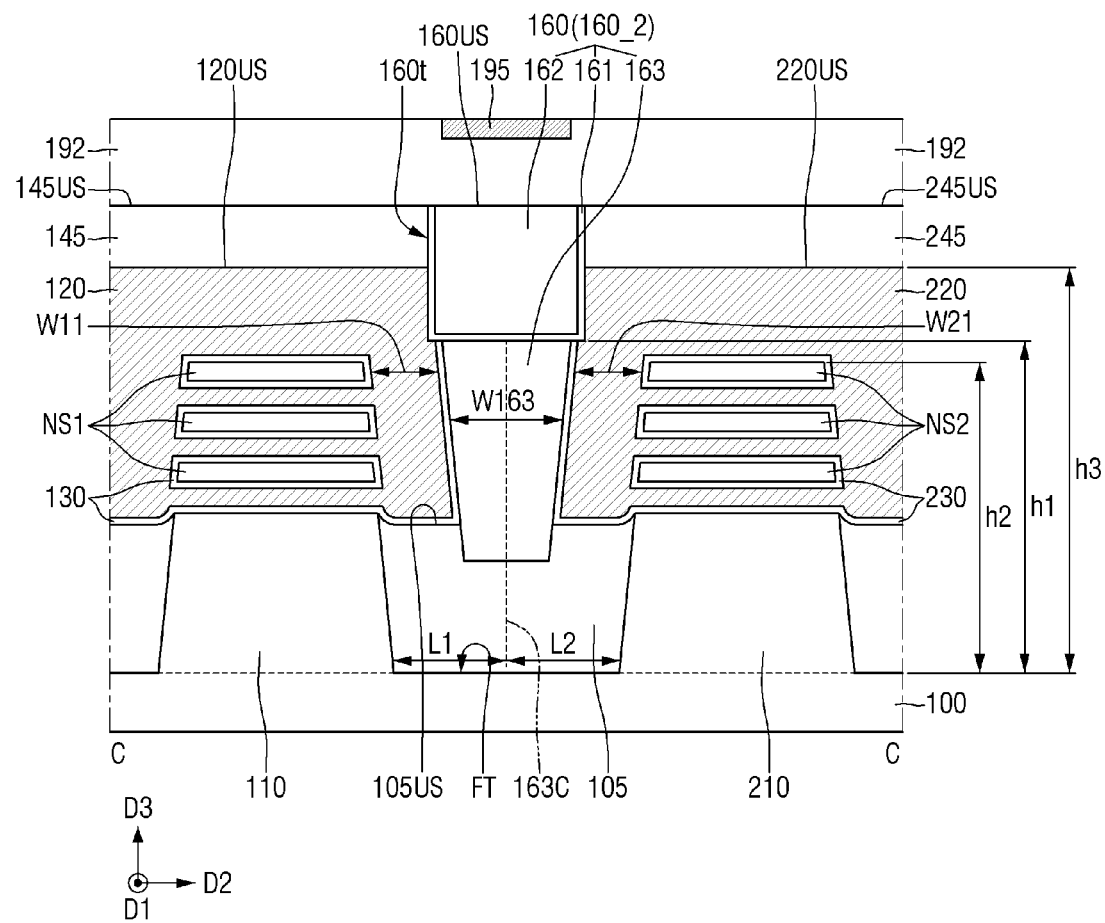
Figure 8:
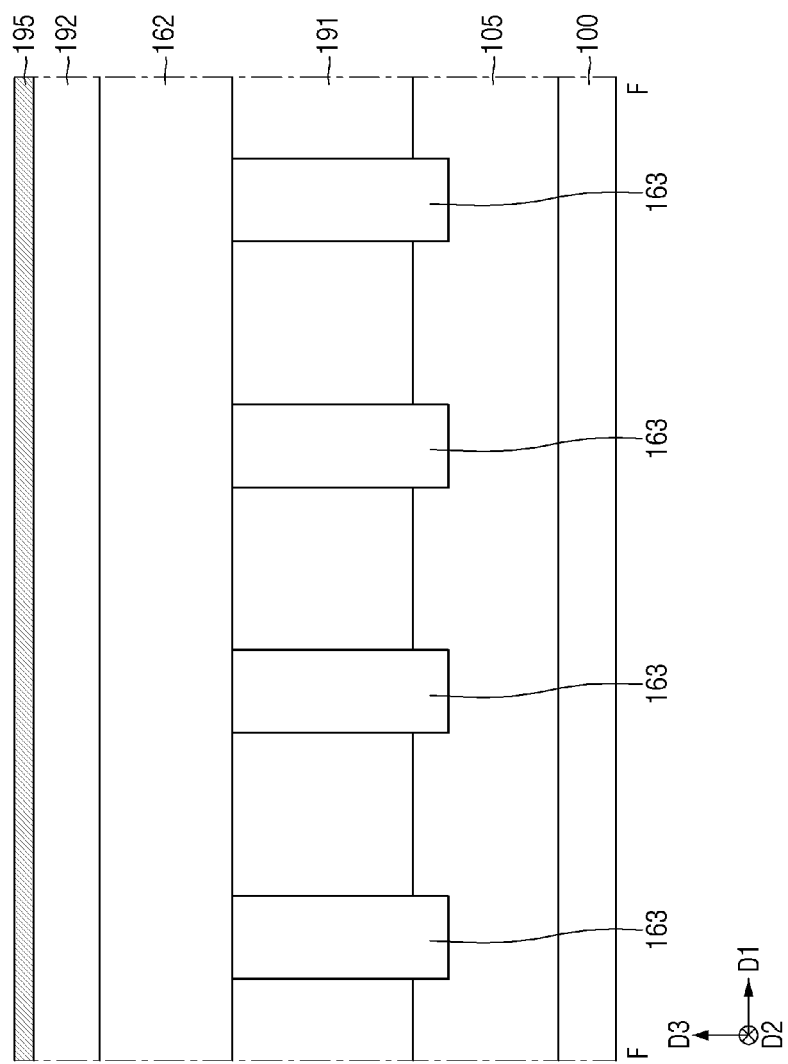

Referring to FIGS. 5A, 5B and 8, the first gate separation structure 160 may include a first gate separation filling film 162 and a first dam structure 163.

For ease of explanation, the first dam structure 163 will be described before the first gate separation filling film 162.

The first dam structure 163 may be a substructure of the first gate filling film formed in the first gate separation structure 160, and a part of the lower side wall of the first dam structure 163 may be in contact with the field insulating film 105. A distance L1 between a center line 163c of the first dam structure 163 and the first lower pattern 110 in a second direction D2 may be the same as a distance L2 between the center line 163c of the first dam structure 163 and the second lower pattern 210 in the second direction D2, and the center line 163c may vertically pass through the center of the fin trench FT, e.g., in a third direction D3. The structure of the first dam structure 163 may be formed by a process according to an embodiment illustrated in FIG. 29, which will be described below.

The remaining upper side wall of the first dam structure 163 is in contact with the first and second gate insulating films 130 and 230, and the upper surface of the first dam structure 163 may be in contact with the first gate separation filling film 162.

The height of the upper surface of the first dam structure 163 may be the same as the height h1 of the first and second gate insulating films 130 and 230.

The first dam structure 163 may have a wedge shape in which a width W163 of the first dam structure 163 in the second direction D2 decrease in a direction downward approaching the substrate 100. The width W163 of the first dam structure 163 in the second direction D2 may be in the range of 4 nm to 8 nm.

The first dam structure 163 may include or be formed of, for example, silicon oxide or oxide-based and silicon nitride or nitride-based insulating material.

The first gate separation trench 160t may be defined by the first interlayer insulating film 191 and the upper surface of the first dam structure 163. The first gate separation trench 160t may be defined by the first gate electrode 120, the second gate electrode 220, the first gate capping pattern 145, and the second gate capping pattern 245.

The first gate separation filling film 162 may fill the first gate separation trench 160t.

The first gate separation filling film 162 may be placed on the first interlayer insulating film 191 and the upper surface of the first dam structure 163. The first gate separation filling film 162 may be in contact with the first dam structure 163, the first gate electrode 120, the second gate electrode 220, the first gate capping pattern 145, and the second gate capping pattern 245.

A part of the first gate separation structure may overlap the first recess insulating film 191R1 of the first interlayer insulating film 191, e.g., in the third direction D3. The other part of the first gate separation structure may not overlap the first interlayer insulating film 191 in the third direction D3.

In the semiconductor device according to some embodiments, the width of the first gate separation structure 160 in the first direction D1 may be greater than the width of the first gate structure GS1 in the first direction D1.

The first gate separation filling film 162 may include or be formed of, for example, silicon oxide or oxide-based insulating material.

Although the first gate separation filling film 162 is shown as a single layer in FIG. 5A, as in FIG. 5B, the first gate separation structure 160 may further include a first gate separation liner 161. The first gate separation liner 161 may extend along the profile of the first gate separation trench 160t. For example, the first gate separation liner 161 may be conformally formed on the first gate separation trench 160t.

The first gate separation liner 161 may act as a barrier that prevents oxygen from being diffused to the first gate electrode 120 and the second gate electrode 220. The first gate separation liner 161 may include or be formed of, for example, a material that prevents diffusion of oxygen. The first gate separation liner 161 may include, but is not limited to, for example, at least one of a polycrystalline semiconductor material, aluminum oxide (AlO), aluminum nitride (AlN), silicon nitride (SiN), silicon oxycarbide (SiOC), silicon oxycarbonitride (SiOCN), silicon carbide (SiC), silicon lanthanum oxide (LaO), and high dielectric constant insulating material. The high dielectric constant insulating material may be one of the materials described in relation to the first gate insulating film 130. For example, the first gate separation liner may be formed of the same material as the first gate insulating film 130.

The second interlayer insulating film 192 may be placed on the first interlayer insulating film 191. The second interlayer insulating film 192 may include or be formed of, but is not limited to, for example, silicon oxide, silicon nitride, silicon oxynitride, FOX (Flowable Oxide), TOSZ (Tonen SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material or a combination thereof.

A wiring line 195 may be placed in the second interlayer insulating film 192. The wiring line 195 may extend in the first direction D1 along the first gate separation structure 160.

For example, the wiring line 195 may be a power lane that supplies power to an integrated circuit that includes the first active pattern AP1, the second active pattern AP2, the first gate electrode 120, and the second gate electrode 220. The wiring line 195 may include or be formed of, for example, at least one of a metal, a metal alloy, a conductive metal nitride, and a two-dimensional (2D) material.

Although not shown, the wirings that transfer the signal to the integrated circuit including the first active pattern AP1, the second active pattern AP2, the first gate electrode 120 and the second gate electrode 220 may be further placed between the first gate separation structures 160 in the second direction D2.

As an example, unlike that shown in the drawings, the wiring line 195 may be in contact with the upper surface 160 of the first gate separation structure.

Figure 9:
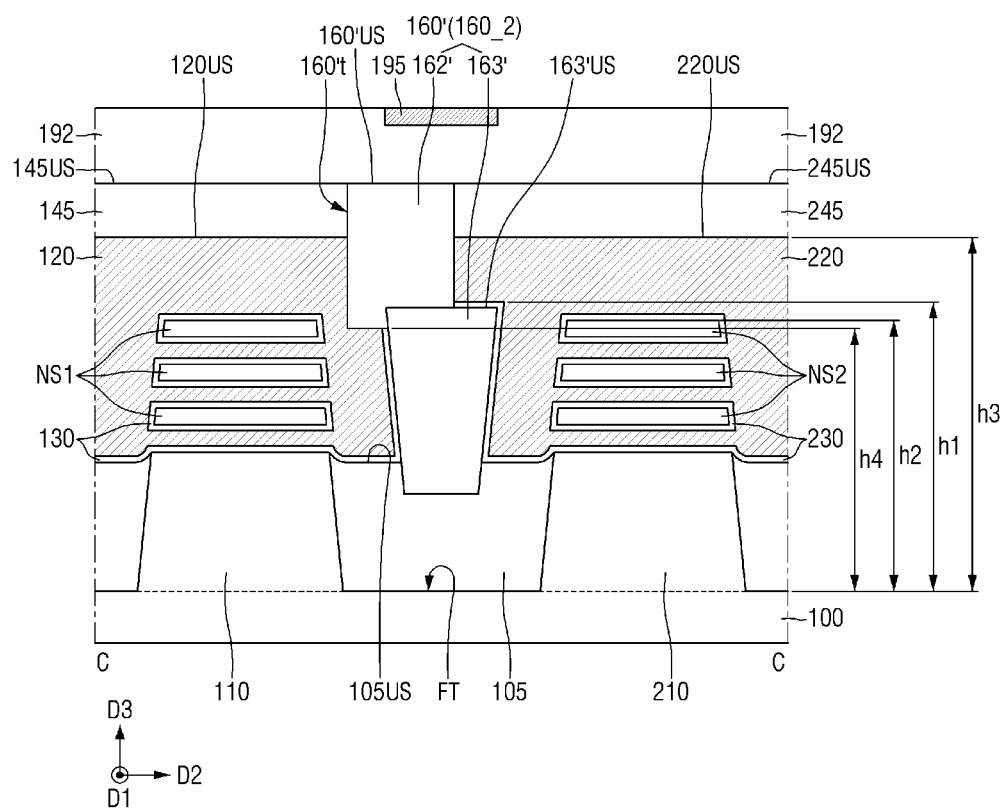
Figure 10:
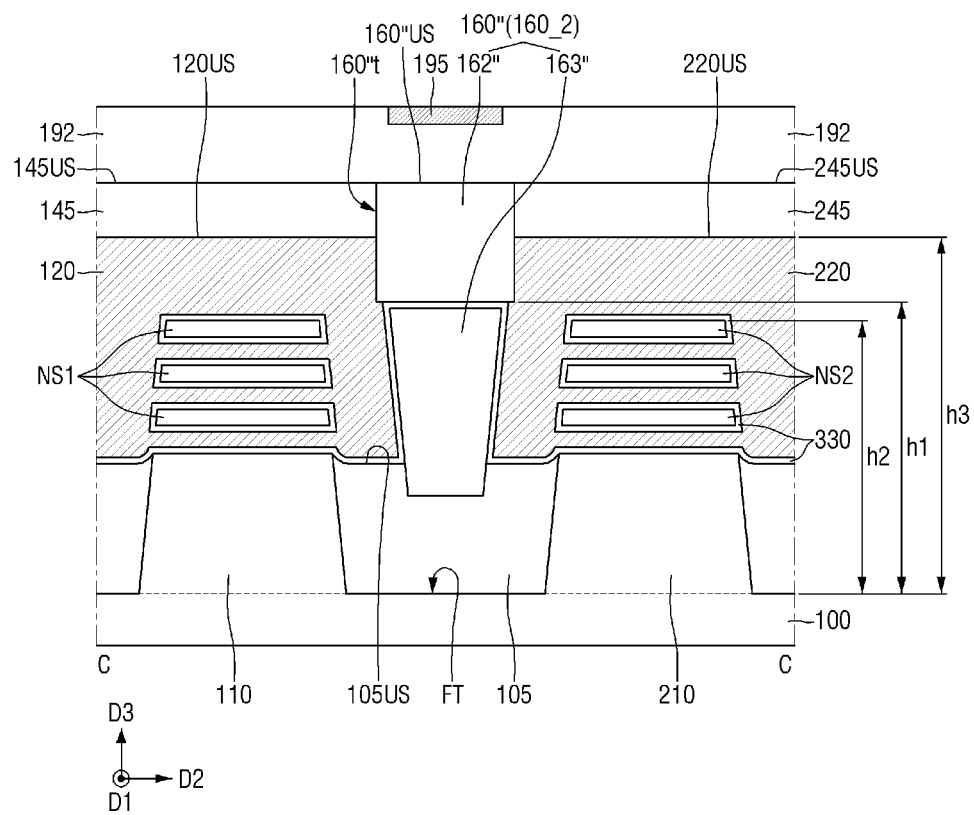
Figure 11:
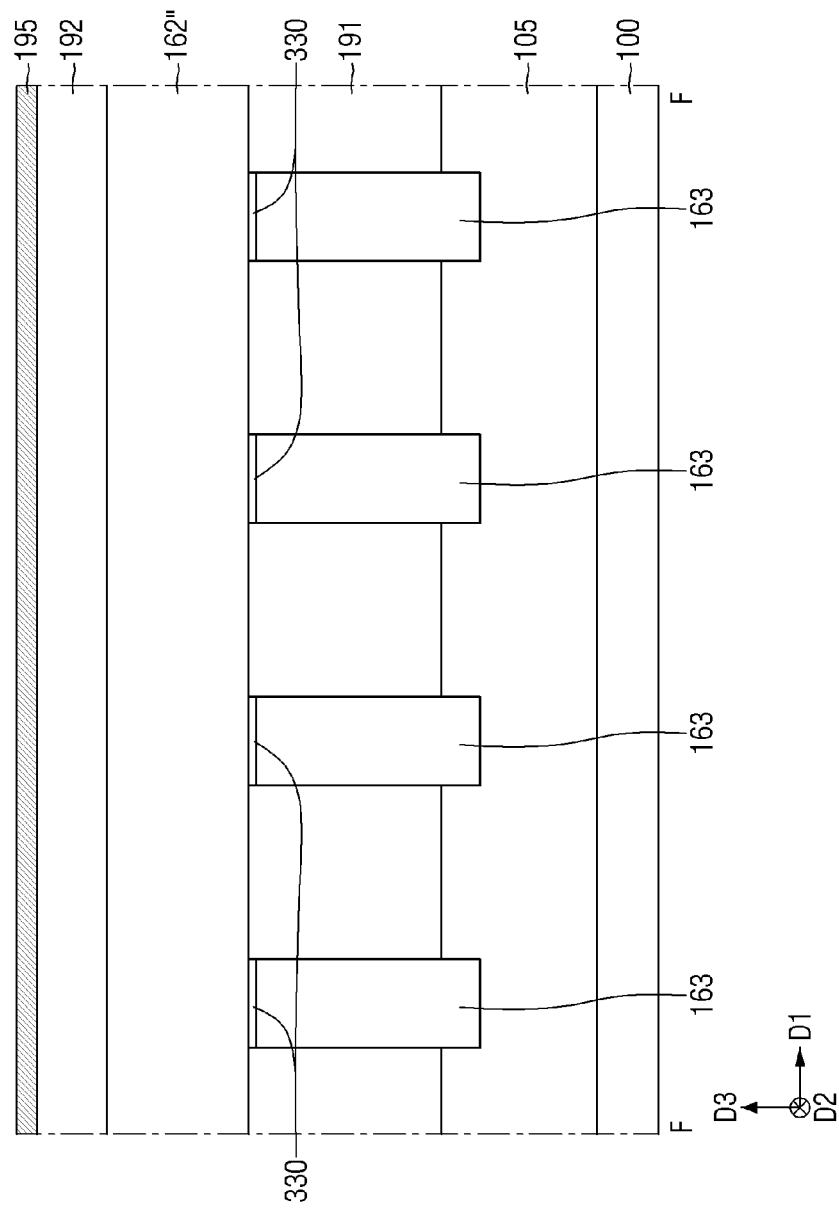
Figure 12:
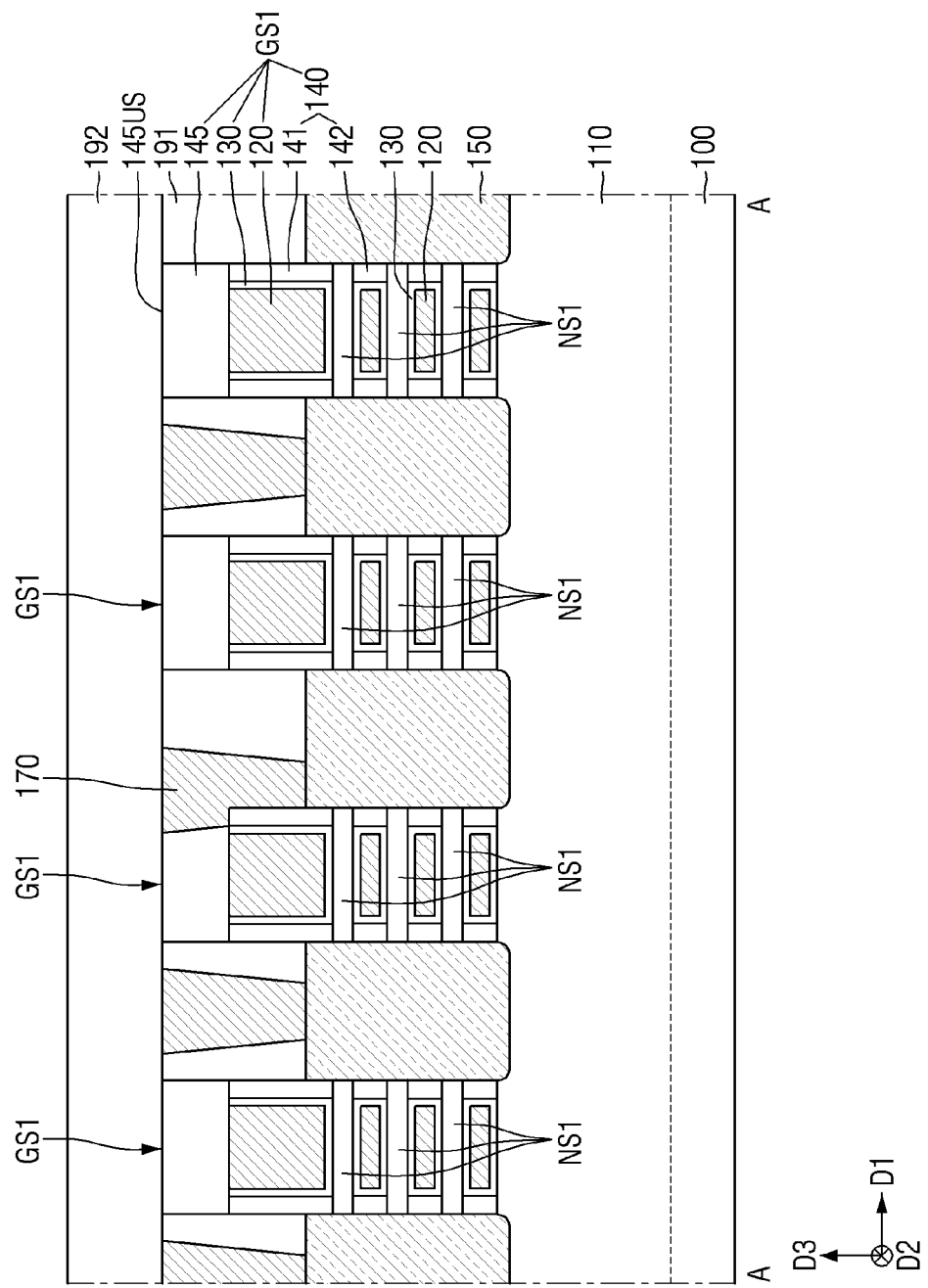
Figure 13:
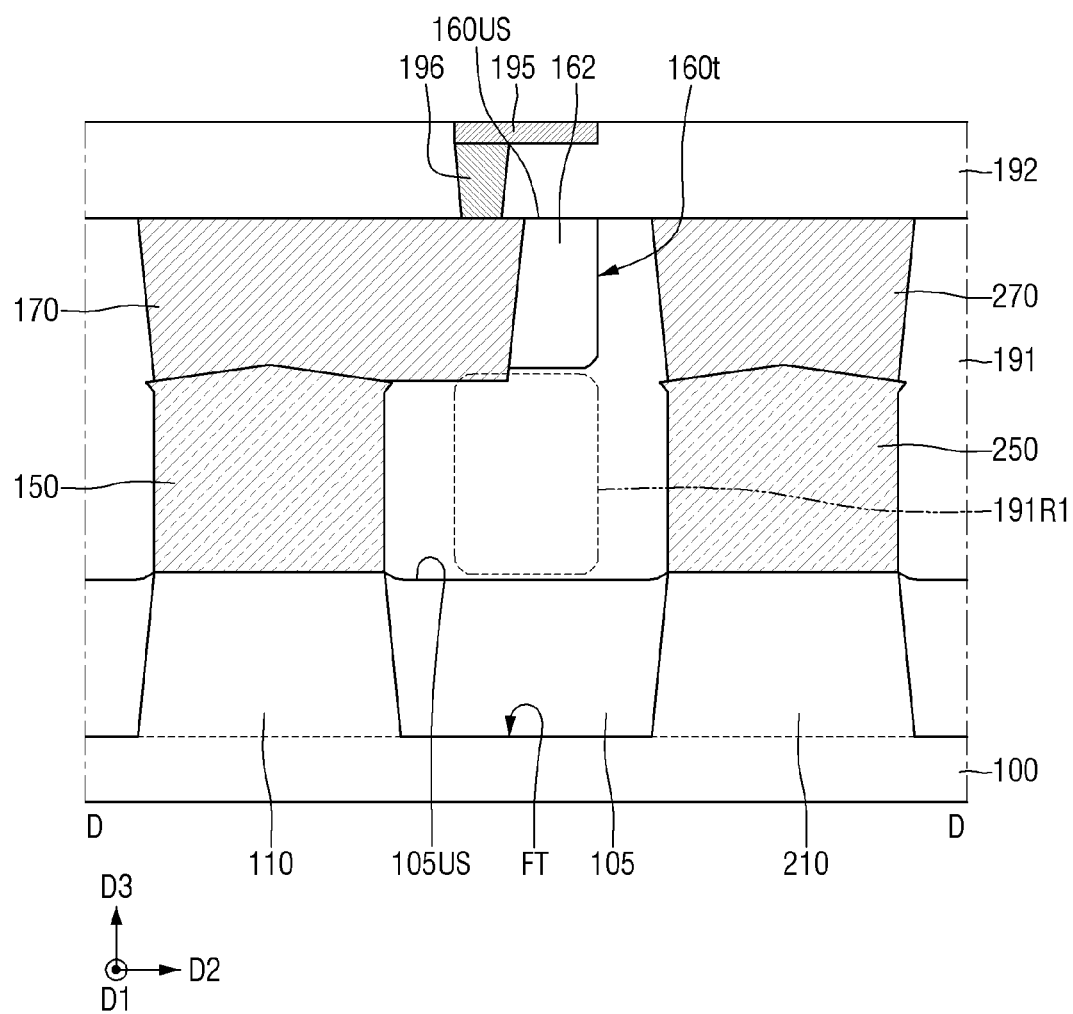

FIGS. 9 to 15 are diagrams for explaining a semiconductor device according to some embodiments, respectively. For convenience of explanation, features different from those described referring to FIGS. 1 to 8 will be mainly described. For reference, FIGS. 9, 10, 14 and 15 are cross-sectional views taken along C-C of FIG. 1, FIG. 11 is a cross-sectional view taken along F-F of FIG. 1, FIG. 12 is a cross-sectional view taken along A-A of FIG. 1, and FIG. 13 is a cross-sectional view taken along D-D of FIG. 1.

FIG. 9 is an example in which the center line of the first gate separation filling film 162 and the center line of the first dam structure 163 do not match, in the semiconductor device according to some embodiments. For example, a first dam structure 163' and a first gate separation filling film 162' may be misaligned, e.g., in a certain degree.

Therefore, the height h1 of the second gate insulating film 230 may be higher than the height h4 of the first gate insulating film 130. For example, at least a part of the second gate insulating film 230 may be placed on an upper surface 163'US of the first dam structure 163', and the second gate insulating film 230 placed on the upper surface 163'US of the first dam structure 163' may have a flat/planar shape having a constant height from a top surface of the substrate 100.

Referring to FIGS. 10 and 11, in the semiconductor device according to some embodiments, a first gate separating filling film 162" may be landed on the gate insulating film 330. For example, a gate insulating film 330 may be placed between the first gate separation filling film 162" and the first dam structure 163", and the first gate separation filling film 162" and the gate insulating film 330 may be in contact with each other.

Referring to FIGS. 12 and 13, the semiconductor device according to some embodiments may further include a first source/drain contact 170 on the first source/drain pattern 150, and a second source/drain contact 270 on the second source/drain pattern 250.

Figure 4:
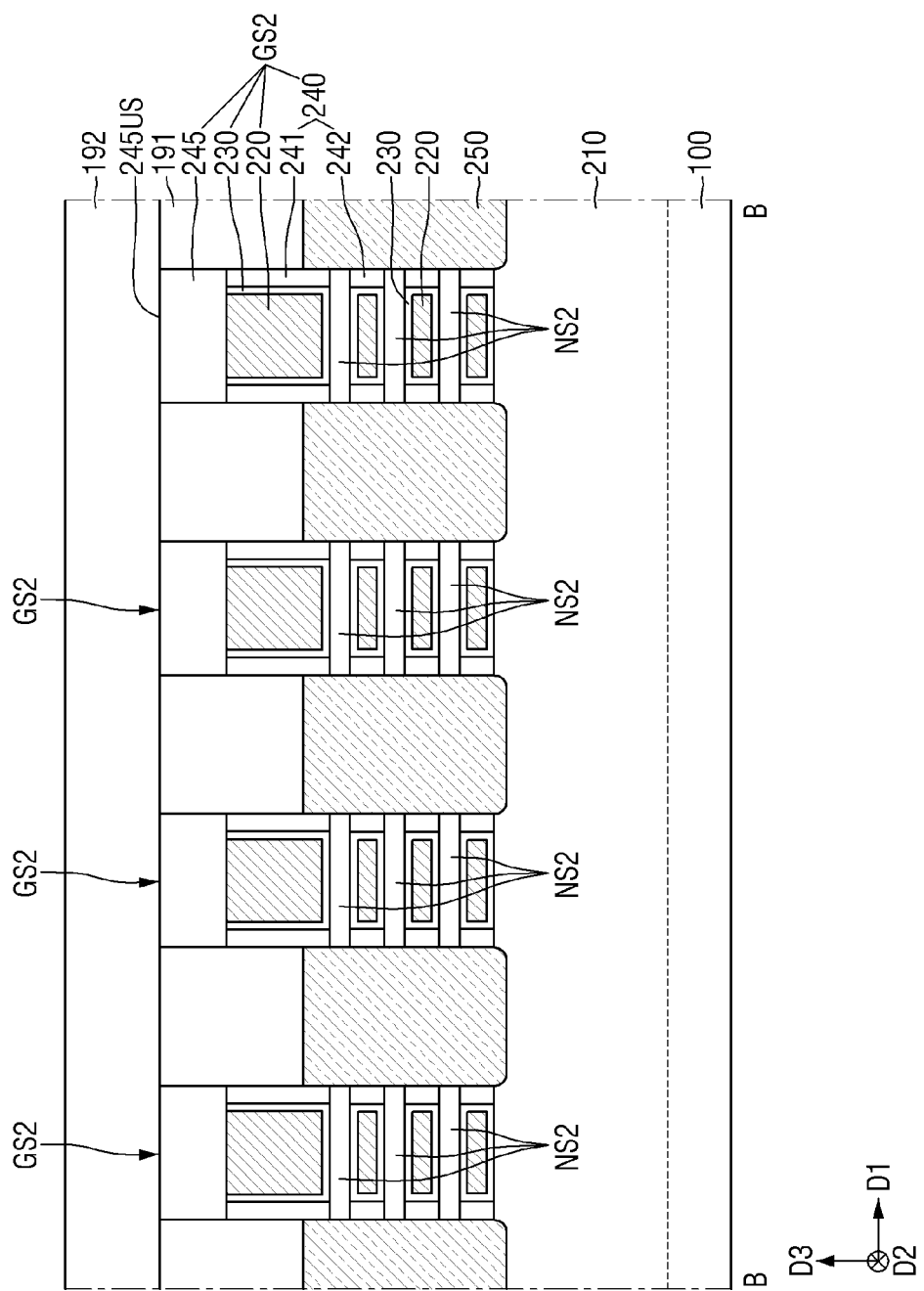
FIGS. 4 to 8 are cross-sectional views taken along lines B-B, C-C, D-D, E-E, and F-F of FIG. 1, respectively.

Although not shown in FIGS. 2 and 4, the first source/drain contact 170 and the second source/drain contact 270 may be placed between adjacent first gate structures GS1 and between the second gate structures GS2 of FIGS. 2 and 4, e.g., as shown in FIG. 12.

The first source/drain contact 170 may be connected to the first source/drain pattern 150, and the second source/drain contact 270 may be connected to the second source/drain pattern 250. The upper surface of the first source/drain contact 170 and the upper surface of the second source/drain contact 270 may be placed on the same plane as the upper surface of the first interlayer insulating film 191 and the upper surface 160US of the first gate separation structure.

At least one of the first source/drain contacts 170 on the first source/drain pattern 150 may be connected to the wiring line 195. A wiring plug 196 may connect the first source/drain contact 170 to the wiring line 195. The wiring plug 196 may be placed in the second interlayer insulating film 192.

A part of the first source/drain contact 170 may be placed inside the first gate separation structure 160. For example, the first source/drain contact 170 may vertically overlap a portion of the first gate separation structure 160. For example, the first source/drain contact 170 may not pass through the first gate separation structure 160 in the second direction D2.

A part of the first source/drain contact 170 may be placed on the first capping pattern 145 and may partially penetrate the first capping pattern 145, and the first source/drain contact 170 and the first gate electrode 120 do not join. For example, the first source/drain contact 170 may contact the first capping pattern in certain embodiments but may not contact the first gate electrode 120.

The upper surface 120US of the first gate electrode 120 may have the same (e.g., a constant) height e.g., from a top surface of the substrate 100, and the upper surface 120US of the first gate electrode in a region adjacent to the first gate separation structure 160 may have a flat/planar shape. Therefore, this structure may be beneficial to prevent the first gate electrode 120 and the first source/drain contact 170 from forming a short circuit defect. This structure may be formed by a RMG (Replacement Metal Gate Process) like a process according to an embodiment illustrated in FIG. 39.

The first source/drain contact 170, the second source/drain contact 270 and the wiring plug 196 may include or be formed of, for example, at least one of metal, metal alloy, conductive metal nitride and two-dimensional (2D) material.

Figure 14:
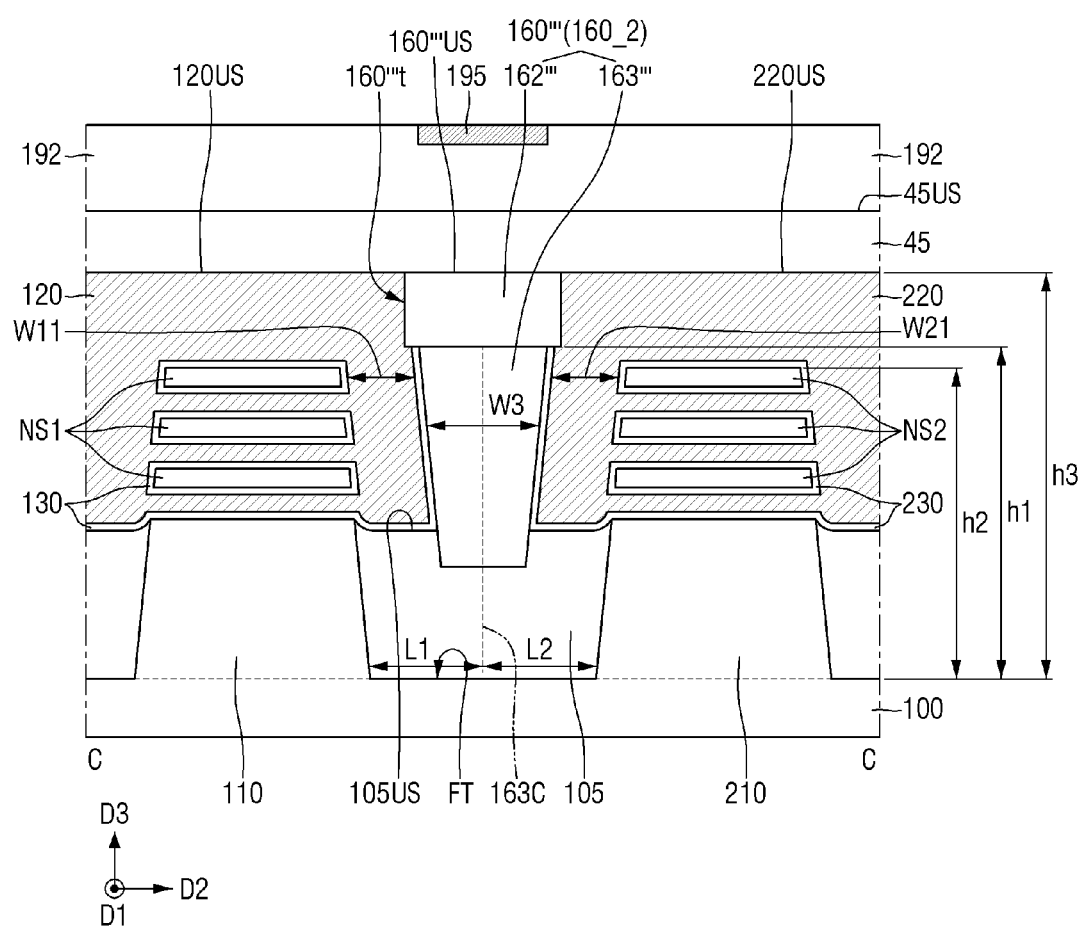

Referring to FIG. 14, in the semiconductor device according to some embodiments, an upper surface 160'''US of a first gate separation structure 160''' forms the same plane as the upper surface 120US of the first gate electrode 120 and the upper surface 220US of the second gate electrode 220.

Therefore, the upper surface 160'''US of the first gate separation structure 160''' may be in contact with the lower surface of the gate capping pattern 45, and may not contact the second interlayer insulating film 192.

Figure 15:
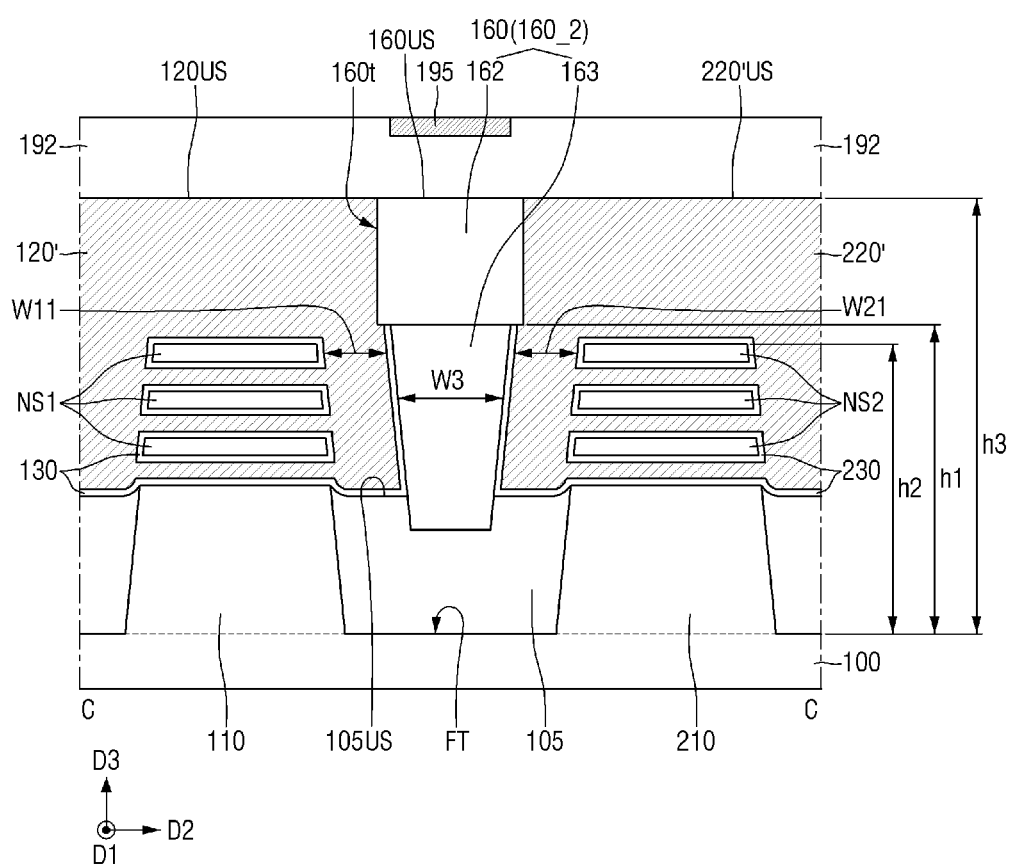

Referring to FIG. 15, in the semiconductor device according to some embodiments, the first gate capping pattern 145 and the second gate capping pattern 245 are not placed.

Accordingly, the upper surface 120'US of the first gate electrode 120' and the upper surface 220'US of the second gate electrode 220' may be in contact with the lower surface of the second interlayer insulating film 192.

Figure 16:
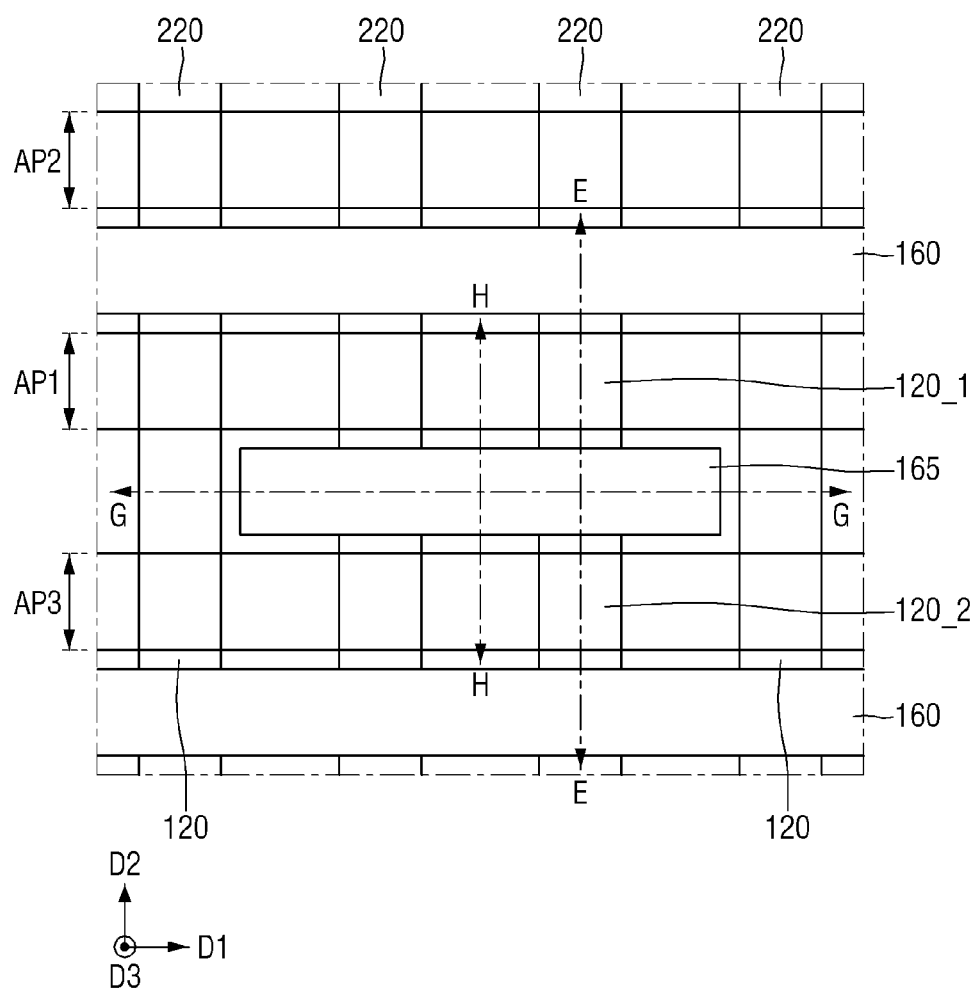
FIGS. 16 to 19 are diagrams for explaining a semiconductor device according to some embodiments.
Figure 17:
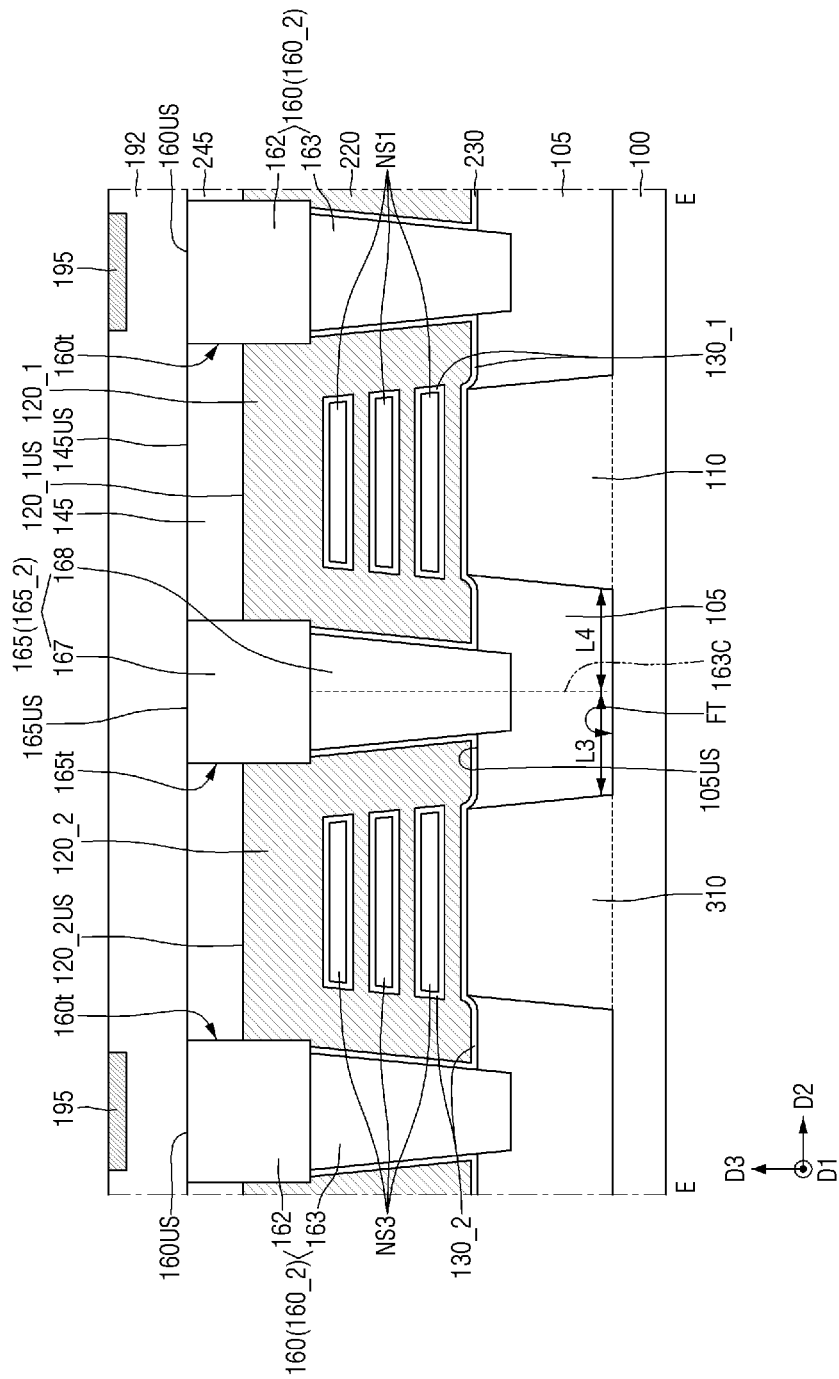
Figure 18:
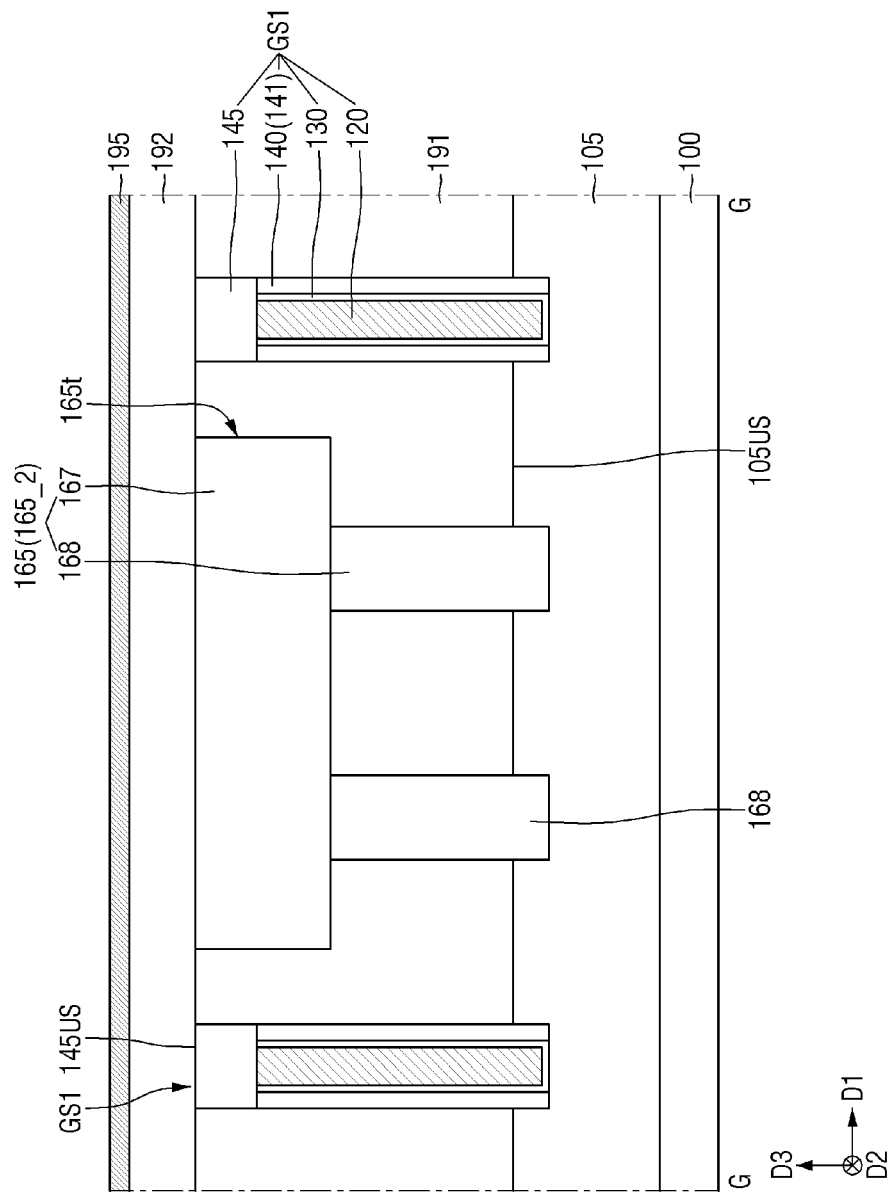
Figure 19:
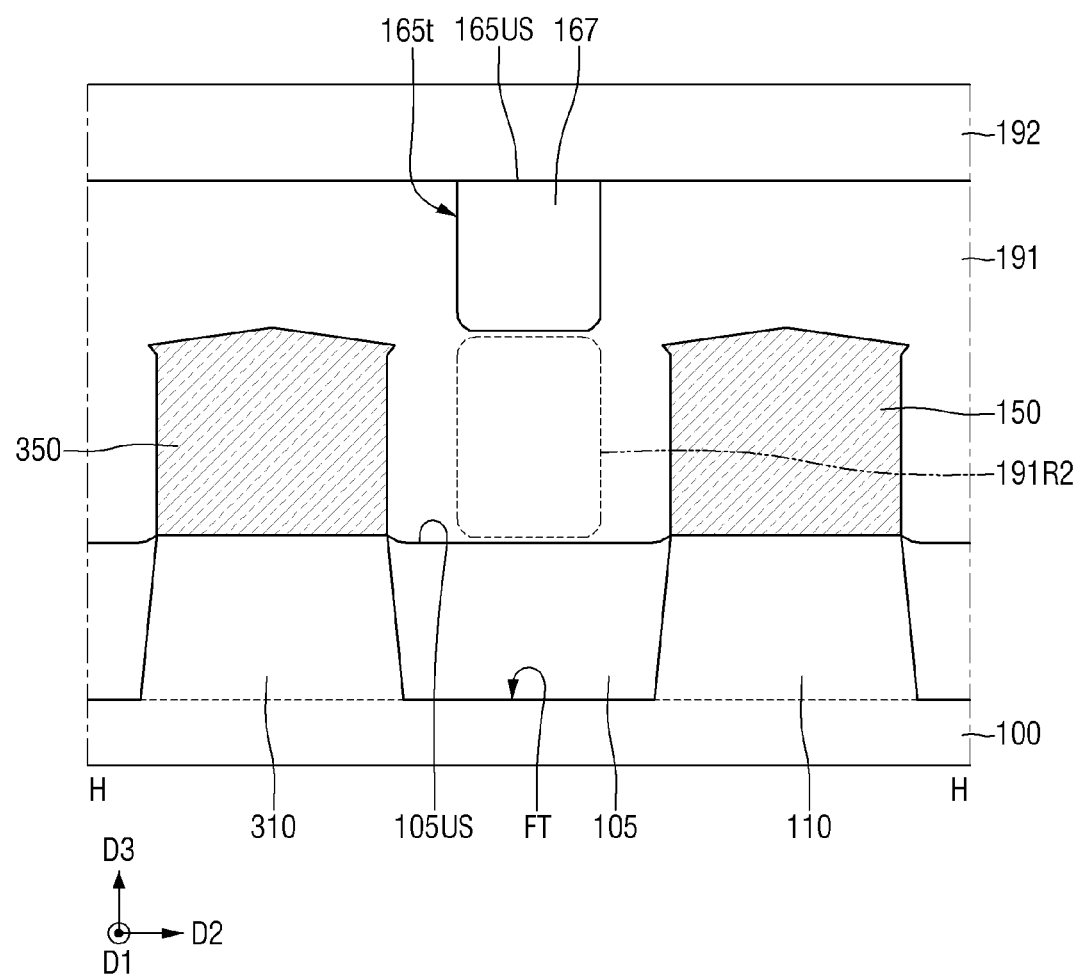

FIGS. 16 to 19 are diagrams for explaining a semiconductor device according to some embodiments. For convenience of explanation, features different from those described referring to FIGS. 1 to 8 will be mainly described. For reference, FIG. 16 is a layout diagram for explaining the semiconductor device according to some embodiments. FIGS. 17 to 19 are cross-sectional views taken along E-E, G-G, and H-H of FIG. 16, respectively.

Referring to FIGS. 16 to 19, a semiconductor device according to some embodiments may further include a second gate separation structure 165 placed between the first gate separation structures 160.

The second gate separation structure 165 may be placed on the substrate 100. The second gate separation structure 165 may be placed on the field insulating film 105.

The second gate separation structure 165 may be placed between the first active pattern AP1 and the third active pattern AP3. The second gate separation structure 165 may be placed between the first lower pattern 110 and the third lower pattern 310.

The upper surface 165US of the second gate separation structure may be placed on the same plane as the upper surface 160US of the first gate separation structure. In the semiconductor device according to some embodiments, the second gate separation structure 165 may be placed in a standard cell.

For example, the length of the first gate separation structure 160 in the first direction D1 may be greater than the length of the second gate separation structure 165 in the first direction D1.

The second gate separation structure 165 may be placed between the first gate structures GS1 intersecting the first active pattern AP1 and the third active pattern AP3. For example, the second gate separation structure 165 may not be in contact with the first gate structures GS1, e.g., in the first direction D1. For example, both end surfaces of the second gate separation structure 165 in the first direction D1 may be spaced apart from the first gate structures GS1. For example, the first interlayer insulating film 191 may be interposed between the end surfaces of the second gate separation structure 165 and respective first gate structures GS1 in the first direction D1.

The second gate separation structure 165 may separate a first_1 gate electrode 120_1 and a first_2 gate electrode 120_2 arranged in the second direction D2. The first gate structure GS1 may be separated by the second gate separation structure 165 to form the first_1 gate electrode 120_1 and the first_2 gate electrode 120_2.

The first_1 gate electrode 120_1 may intersect the first active pattern AP1. The first_1 gate electrode 120_1 may be placed on the first lower pattern 110 and wrap the first sheet pattern NS1. The first and first_2 gate electrodes 120_2 may intersect the third active pattern AP3. The first_2 gate electrode 120_2 may be placed on a third lower pattern 310 and wrap a third sheet pattern NS3.

The first_1 gate insulating film 130_1 may extend along the periphery of the first sheet pattern NS1, the side wall of the first dam structure 163, the upper surface of the first lower pattern 110, and the side wall of the second dam structure 168. The first_2 gate insulating film 130_2 may extend along the periphery of the third sheet pattern NS3, the side wall of the first dam structure 163, the third lower pattern 310 and the side wall of the second dam structure 168. A first_1 gate capping pattern 145_1 may be placed on the first_1 gate electrode 120_1, and a first_2 gate capping pattern 145_2 may be placed on the first_2 gate electrode 120_2. The upper surface 145US of the first_1 gate capping pattern and the upper surface 145US of the first_2 gate capping pattern may be placed on the same plane as the upper surface 165US of the second gate separation structure.

The first_1 gate electrode 120_1, the first_1 gate insulating film 130_1, and the first_1 gate capping pattern 145_1 may be included in the first_1 gate structure. The first_2 gate electrode 120_2, the first_2 gate insulating film 130_2, and the first_2 gate capping pattern 145_2 may be included in the first_2 gate structure. The first_1 gate structure and the first_2 gate structure may be separated by the second gate separation structure 165. The first_1 gate structure and the first_2 gate structure may be placed between the first gate structures GS1 intersecting the first active pattern AP1 and the third active pattern AP3.

The first source/drain pattern 150 may be placed on the first lower pattern 110. The first source/drain pattern 150 may be connected to the first sheet pattern NS1 adjacent in the first direction D1. The third source/drain pattern 350 may be placed on the third lower pattern 310. The third source/drain pattern 350 may be connected to the third sheet pattern NS3 adjacent in the first direction D1. The second gate separation structure 165 may be placed between the first source/drain pattern 150 and the third source/drain pattern 350.

A second recess insulating film 191R2 of the first interlayer insulating film 191 may be placed between the second gate separation structure 165 and the field insulating film 105. The second recess insulating film 191R2 may be a portion of the first interlayer insulating film 191 that overlaps the second gate separation structure 165 in the third direction D3.

The second gate separation structure 165 may be placed in a second gate separation trench 165t defined by the first interlayer insulating film 191, the second dam structure 168, the first_1 gate capping pattern 145_1 and the first_2 gate capping pattern 145_2. A part of the second gate separation structure 165 may fill the second gate separation trench 165t.

The second gate separation trench 165t and the second dam structure 168 may separate the first_1 gate electrode 120_1 and the first_2 gate electrode 120_2.

The second gate separation structure 165 may include a second gate separation filling film 167 and a second dam structure 168. The second gate separation filling film 167 may be placed on the first interlayer insulating film 191 and the upper surface of the second dam structure 168. The second gate separation filling film 167 may be in contact with the second dam structure 168, the first gate electrodes 120_1 and 120_2, and the first gate capping pattern 145. The second gate separation filling film 167 may fill the second gate separation trench 165t.

Contents of the materials included in the second gate separation filling film 167 and the second dam structure 168 may be the same as the contents of the first gate separation filling film 162 and the first dam structure 163.

Figure 20:
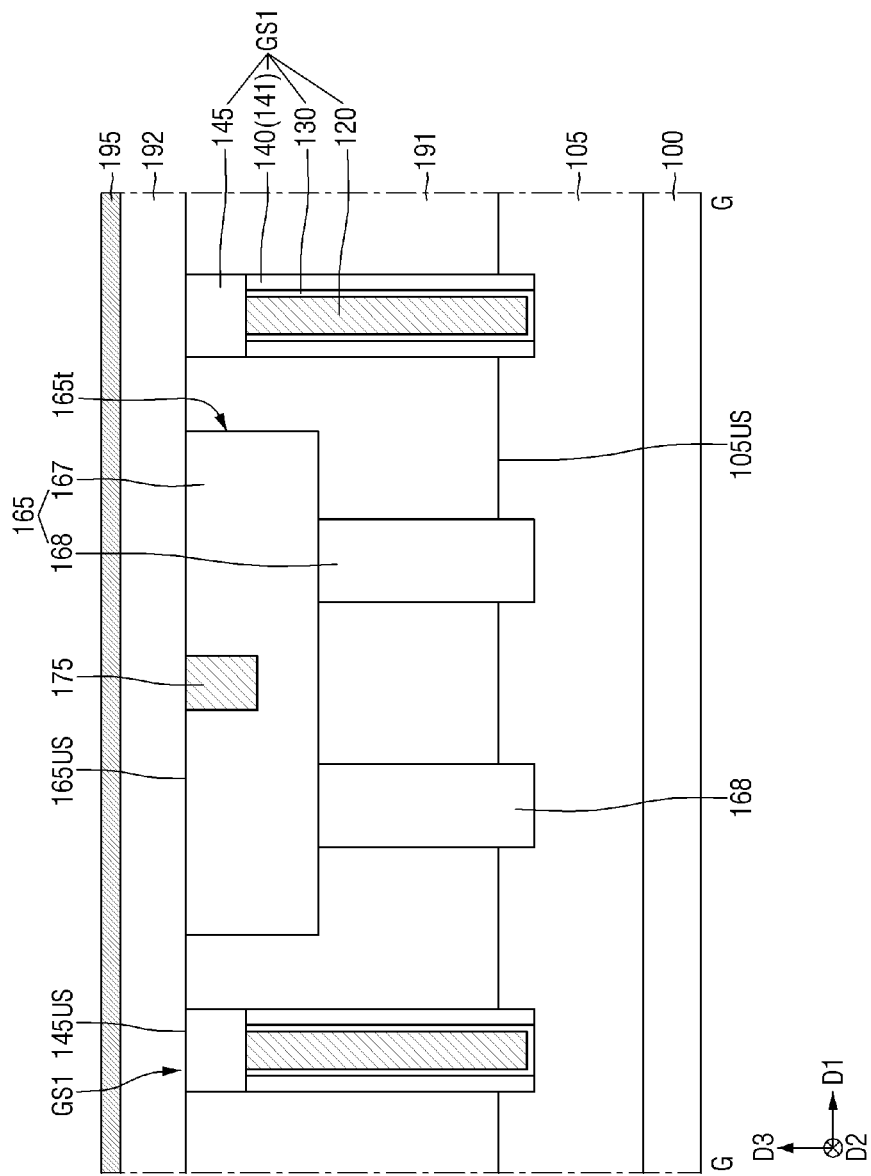
FIGS. 20 and 21 are diagrams for explaining a semiconductor device according to some embodiments.
Figure 21:
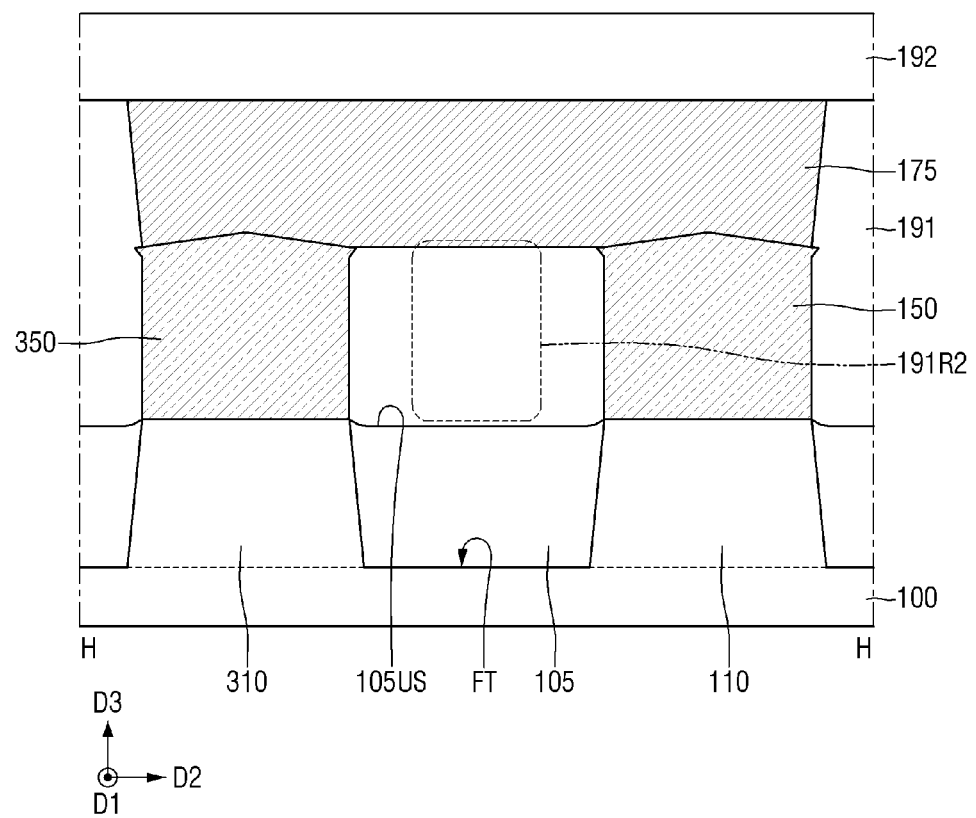

FIGS. 20 and 21 are diagrams for explaining a semiconductor device according to some embodiments. For convenience of explanation, features different from those described referring to FIGS. 16 to 19 will be mainly described. For reference, FIG. 20 is a cross-sectional view taken along G-G of FIG. 16, and FIG. 21 is a cross-sectional view taken along H-H of FIG. 16.

Referring to FIGS. 20 and 21, the semiconductor device according to some embodiments may further include a first connecting source/drain contact 175 placed on the first source/drain pattern 150 and the third source/drain pattern 350.

The first connecting source/drain contact 175 may be connected to the first source/drain pattern 150 and the third source/drain pattern 350. An upper surface of the first connecting source/drain contact 175 may be placed in the same plane as the upper surface of the first interlayer insulating film 191 and the upper surface 165US of the second gate separation structure.

A part of the first connecting source/drain contact 175 may be placed inside the second gate separation structure 165. For example, the second gate separation structure 165 may surround and contact a bottom surface and side surfaces of a portion of the first connecting source/drain contact 175. The first connecting source/drain contact 175 may pass through the second gate separation structure 165 in the second direction D2. The first connecting source/drain contact 175 may include or be formed of, for example, at least one of a metal, a metal alloy, a conductive metal nitride and a two-dimensional (2D) material.

Figure 22:
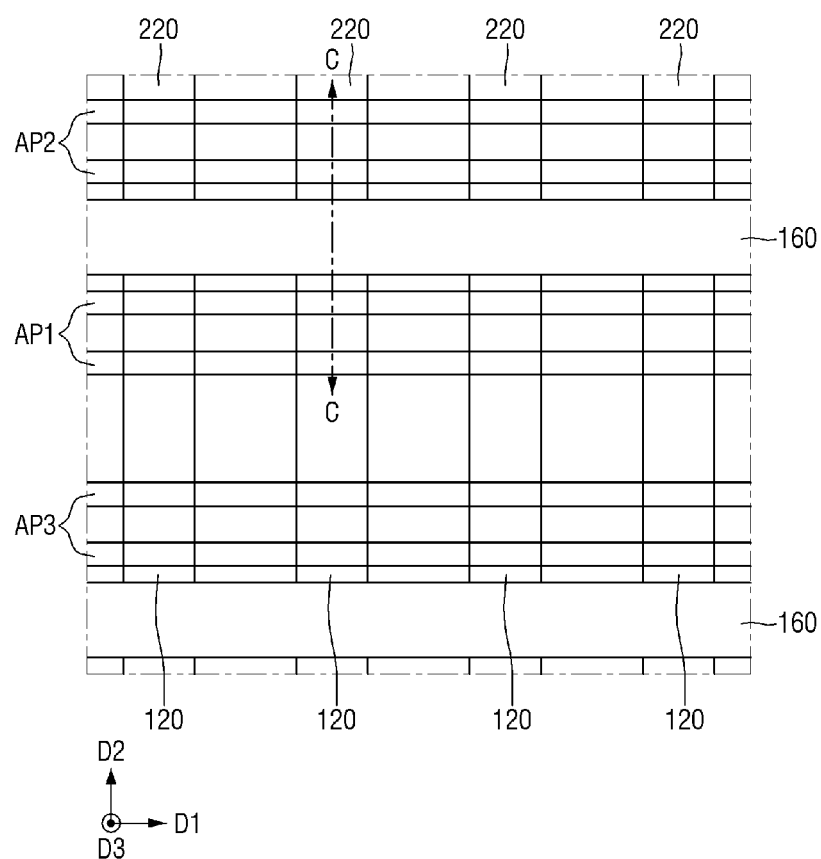
FIGS. 22 to 24 are diagrams for explaining a semiconductor device according to some embodiments.
Figure 23:
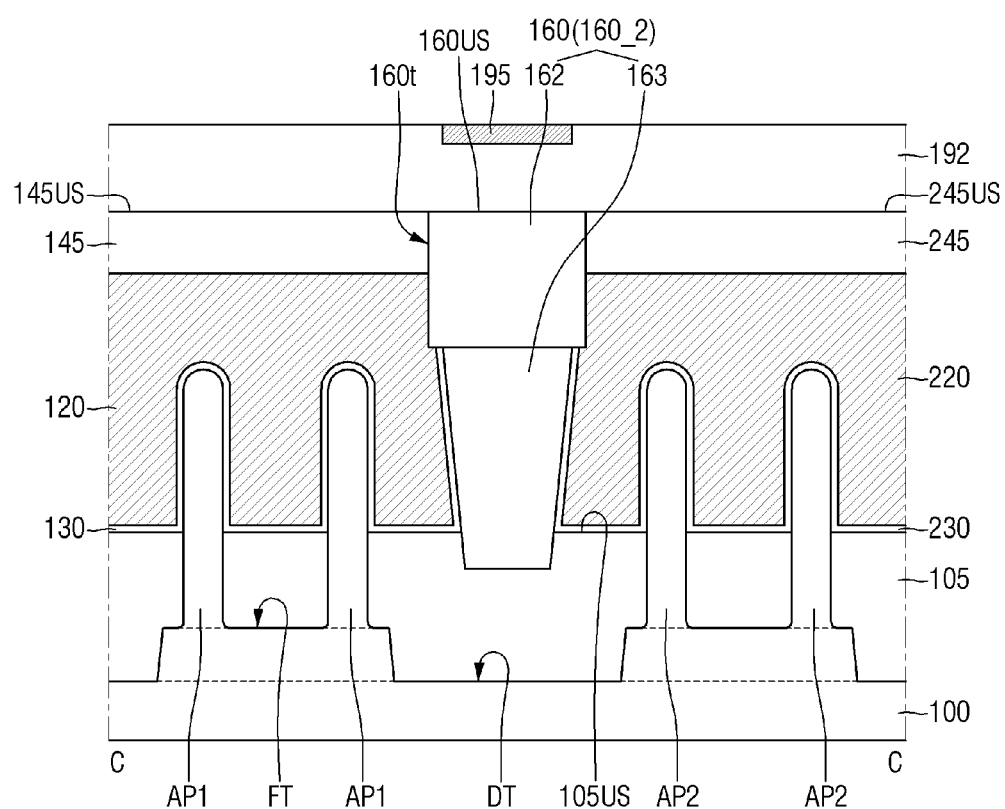
Figure 24:
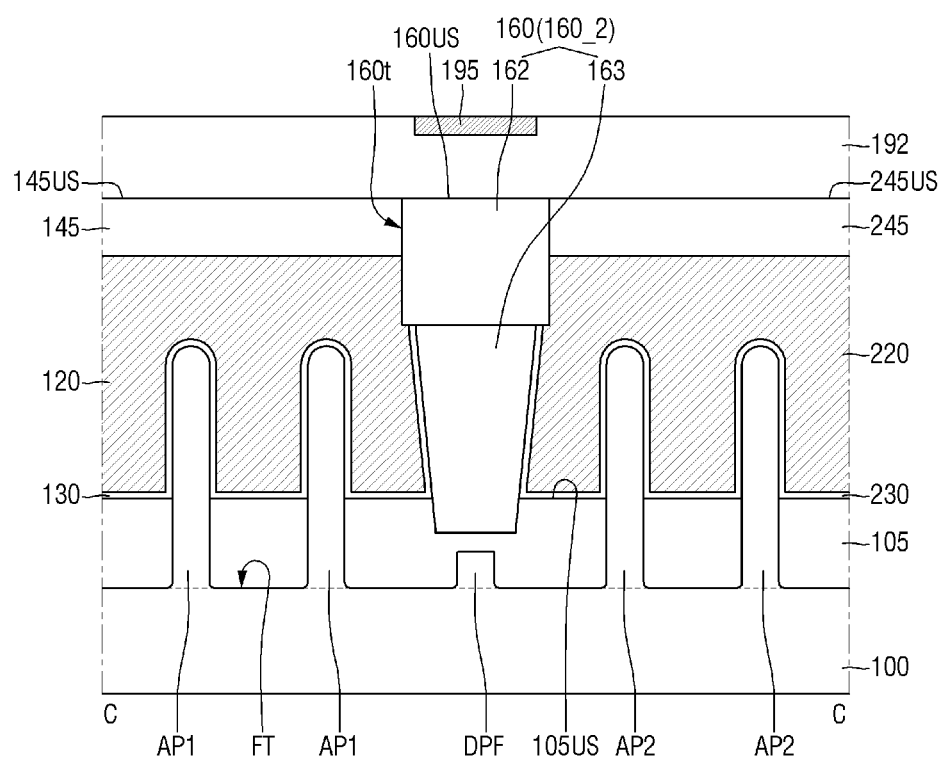

FIGS. 22 to 24 are diagrams for explaining a semiconductor device according to some embodiments. For convenience of explanation, features different from those described referring to FIGS. 1 to 8 will be mainly described. For reference, FIG. 22 is a layout diagram for explaining the semiconductor device according to some embodiments. FIGS. 23 and 24 are cross-sectional views taken along C-C of FIG. 22.

Referring to FIGS. 22 to 23, in the semiconductor device according to some embodiments, each of the first to third active patterns AP1, AP2 and AP3 may be a fin-type pattern.

Each of the first to third active patterns AP1, AP2 and AP3 may be defined by the fin trench FT.

The first gate electrode 120 may cover the side wall of the first active pattern AP1 protruding upward from the upper surface 105US of the field insulating film. The second gate electrode 220 may cover the side wall of the second active pattern AP2 protruding upward from the upper surface 105US of the field insulating film. The first gate insulating film 130 may be formed along the profile of the first active pattern AP1 protruding upward from the upper surface 105US of the field insulating film. For example, the first gate insulating film 130 may be conformally formed on an exposed portion (protruding portion) of the first active pattern AP1. For example, the first gate insulating film 130 may cover and contact the protruding portion of the first active pattern AP1. The second gate insulating film 230 may be formed along the profile of the second active pattern AP2 protruding upward from the upper surface 105US of the field insulating film. For example, the second gate insulating film 230 may be conformally formed on the protruding portion of the second active pattern AP2. For example, the second gate insulating film 230 may cover and contact the protruding portion of the second active pattern AP2.

Referring to FIGS. 22 and 23, each of the first to third active patterns AP1, AP2 and AP3 may be placed inside an active region defined by a deep trench DT. The first gate separation structure 160 may be placed on the field insulating film 105 that fills the deep trench DT.

In FIG. 24, each of the first to third active patterns AP1, AP2 and AP3 may be placed between dummy fin-type patterns DPF adjacent to each other in the second direction D2. An upper surface of the dummy fin-type pattern DPF may be covered with the field insulating film 105. For example, the upper surface and side surfaces of the dummy fin-type pattern DPF may contact the field insulating film 105.

Although the number of each of the first to third active patterns AP1, AP2 and AP3 is shown as two, this is merely for convenience of explanation, and the number thereof is not limited thereto. The number of each of the first to third active patterns AP1, AP2 and AP3 may be one or three or more.

FIGS. 25 to 40 are intermediate stage diagrams for explaining a method of manufacturing the semiconductor device according to some embodiments. The first gate separation structure 160 described referring to FIGS. 1 to 8 may be manufactured accordingly.

FIGS. 26 to 32, 34, 36, 38 and 40 are cross-sectional views taken along M-M of FIG. 25. FIGS. 33, 35, 37 and 39 are cross-sectional views taken along L-L of FIG. 25. In the following description of the manufacturing method, the repeated contents of those explained using FIGS. 1 to 24 will be briefly explained or omitted.

Figure 26:
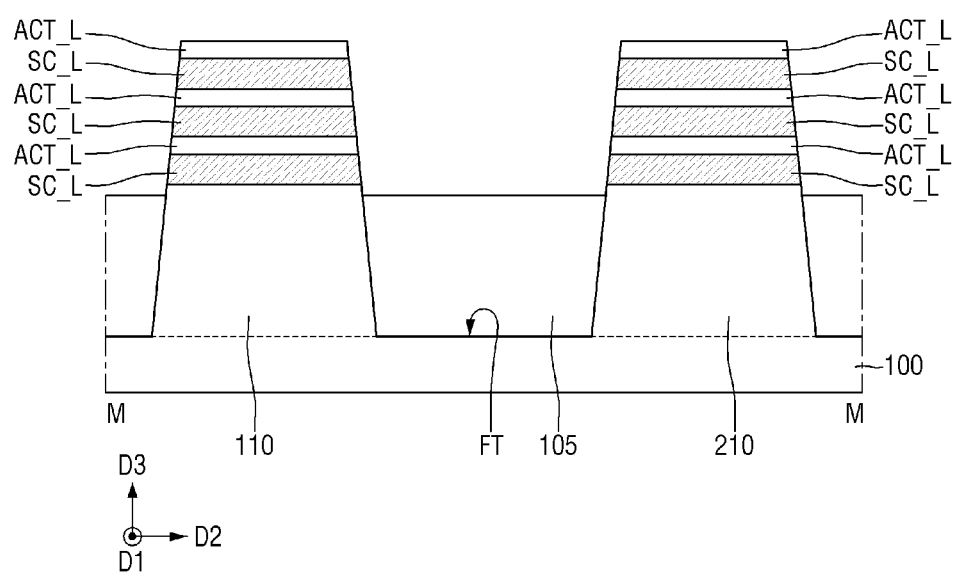

Referring to FIGS. 25 and 26, first and second preliminary active pattern structures AP1_p and AP2_p extending in the first direction D1, and a field insulating film 105 between the first and second preliminary active pattern structures AP1_p and AP2_p are formed.

The first and second preliminary active pattern structures AP1_p, AP2_p are spaced apart from each other in the second direction D2.

The first preliminary active pattern structure AP1_p may include a first lower pattern 110, and a sacrificial pattern SC_L and an active pattern ACT_L that are alternately stacked on the first lower pattern 110.

The second preliminary active pattern structure AP2p may include a second lower pattern 210, and a sacrificial pattern SC_L and an active pattern ACT_L that are alternately stacked on the second lower pattern 210.

For example, the sacrifice pattern SC_L may include or be formed of a silicon-germanium film. The active pattern ACT_L may include or be formed of a silicon film.

Figure 27:
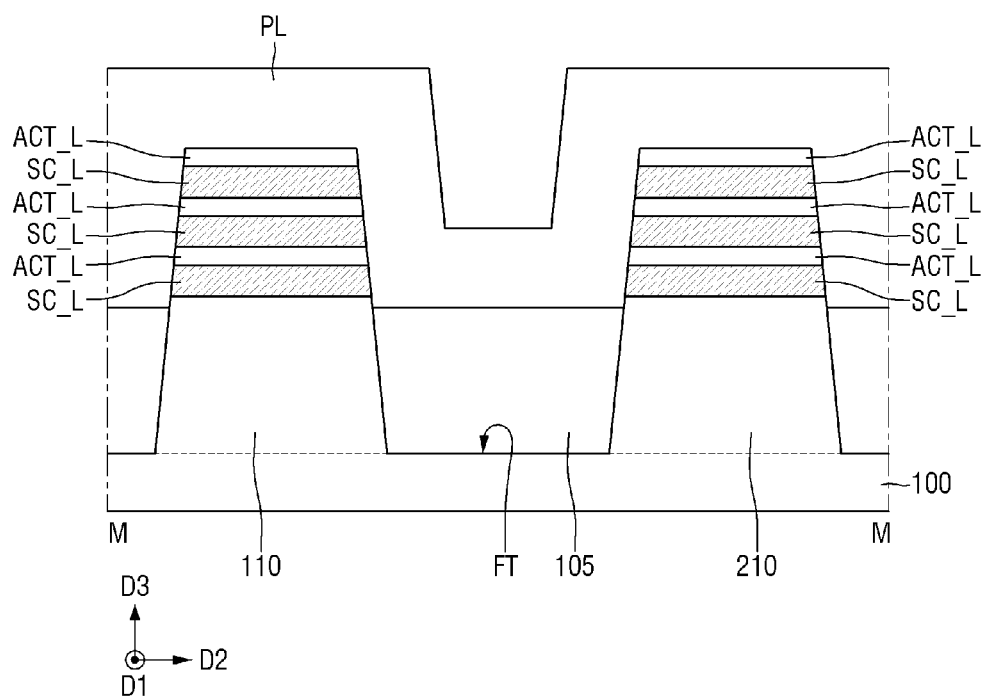

Referring to FIG. 27, a dummy conductive material film PL extending along the profile of the field insulating film 105 and the first and second preliminary active pattern structures AP1_p and AP2_p may be formed. For example, the dummy conductive material film PL may be conformally formed on the field insulting film 105 and the first and second preliminary active pattern structures AP1_p and AP2_p.

The dummy conductive material film PL may include or be formed of, but is not limited to, for example, polysilicon. The dummy conductive material film PL may be formed by, but is not limited to, an atomic layer deposition method (ALD).

Figure 28:
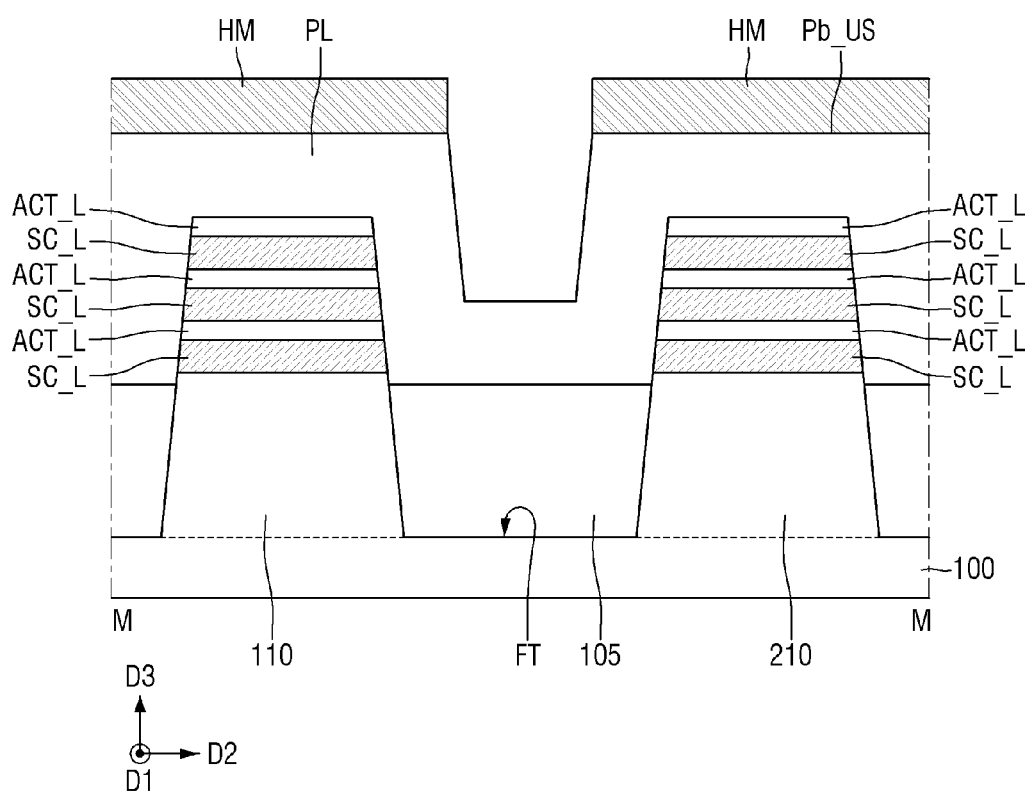

Referring to FIG. 28, a hard mask pattern HM may be formed on an uppermost surface PL_US of the dummy conductive material film PL.

The hard mask pattern HM may include or be formed of, but is not limited to, for example, silicon nitride. Although the hard mask pattern HM is formed only on the uppermost surface PL_US of the dummy conductive material film PL, using a physical vapor deposition (PVD) method, the embodiment is not limited thereto.

The hard mask pattern HM and the dummy conductive material film PL may have etching selectivity having different etch rates from each other.

Figure 29:
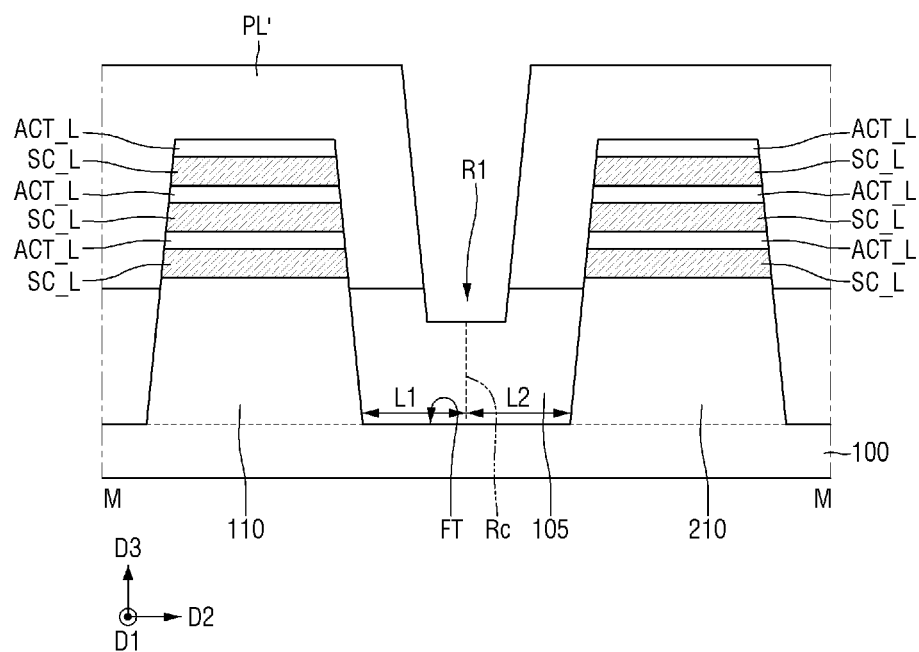

Referring to FIG. 29, by etching the hard mask pattern HM and the dummy conductive material film PL, using the etching selectivity between the hard mask pattern HM and the dummy conductive material film PL, a part of the field insulating film 105 may be etched, and a first recess R1 of the field insulating film 105 may be formed in the field insulating film 105. The etching may include or may be, but is not limited to, wet etching and dry etching.

The width of the first recess R1 in the second direction D2 may decrease in a downward direction approaching the substrate 100.

Further, a center line Rc of the first recess R1 may coincide with the center of the fin trench FT. For example, a distance L1 between the center line Rc of the first recess R1 and the first lower pattern 110 may be the same as a distance L2 between the center line Rc of the first recess R1 and the second lower pattern Rc. The first recess R1 may be placed at the center of the first preliminary active pattern structure AP1_p and the second preliminary active pattern structure AP2p in a self-aligned manner, through etching of the hard mask pattern HM and the dummy conductive material film PL.

Figure 30:
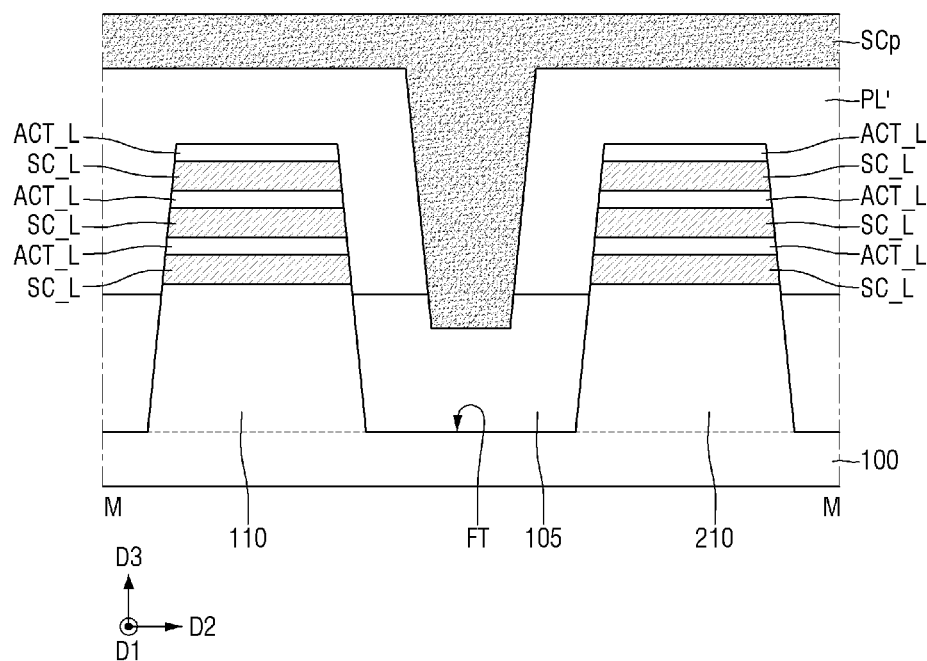

Referring to FIG. 30, a pre sacrificial film SCp that covers the first recess R1 and the dummy conductive material film PL' may be formed. The pre sacrificial film SCp may include or may be, but is not limited to, for example, a silicon-germanium film.

Figure 31:
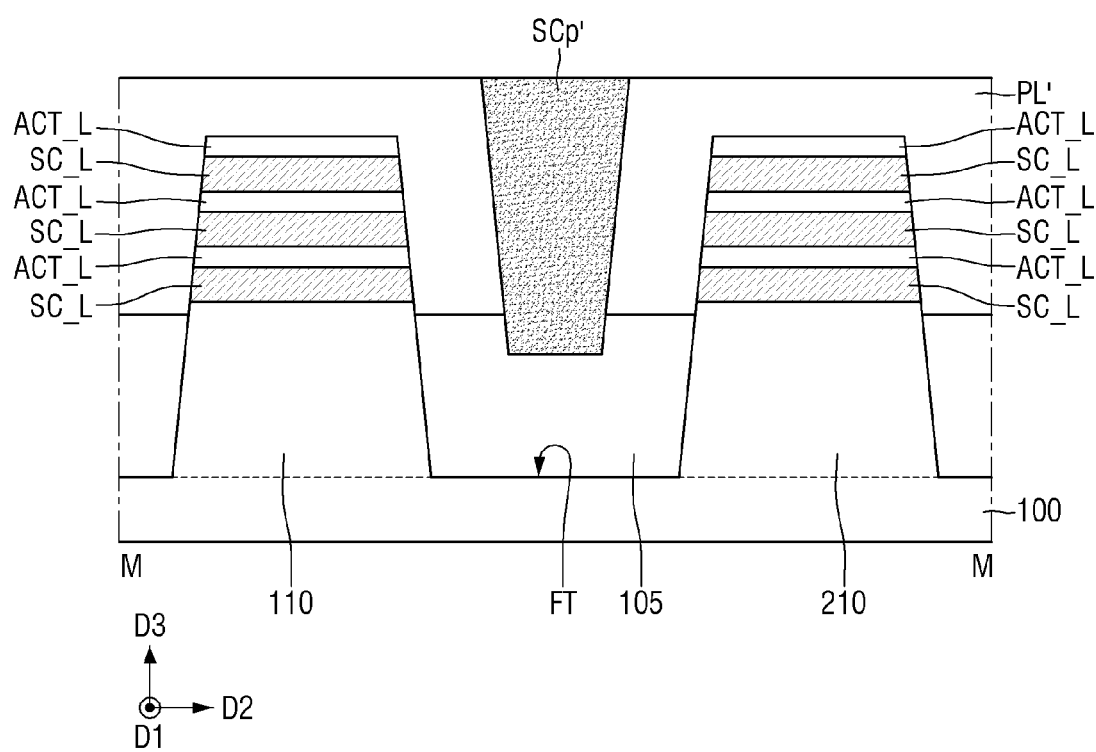

Referring to FIG. 31, a flattening process (e.g., CMP) may be performed on the pre sacrificial film SCp and the dummy conductive material film PL' to form a sacrificial film pattern SCp' from the pre sacrificial film SCp. The width of the sacrificial film pattern SCp' in the second direction D2 may decrease in a downward direction approaching the substrate 100.

Figure 32:
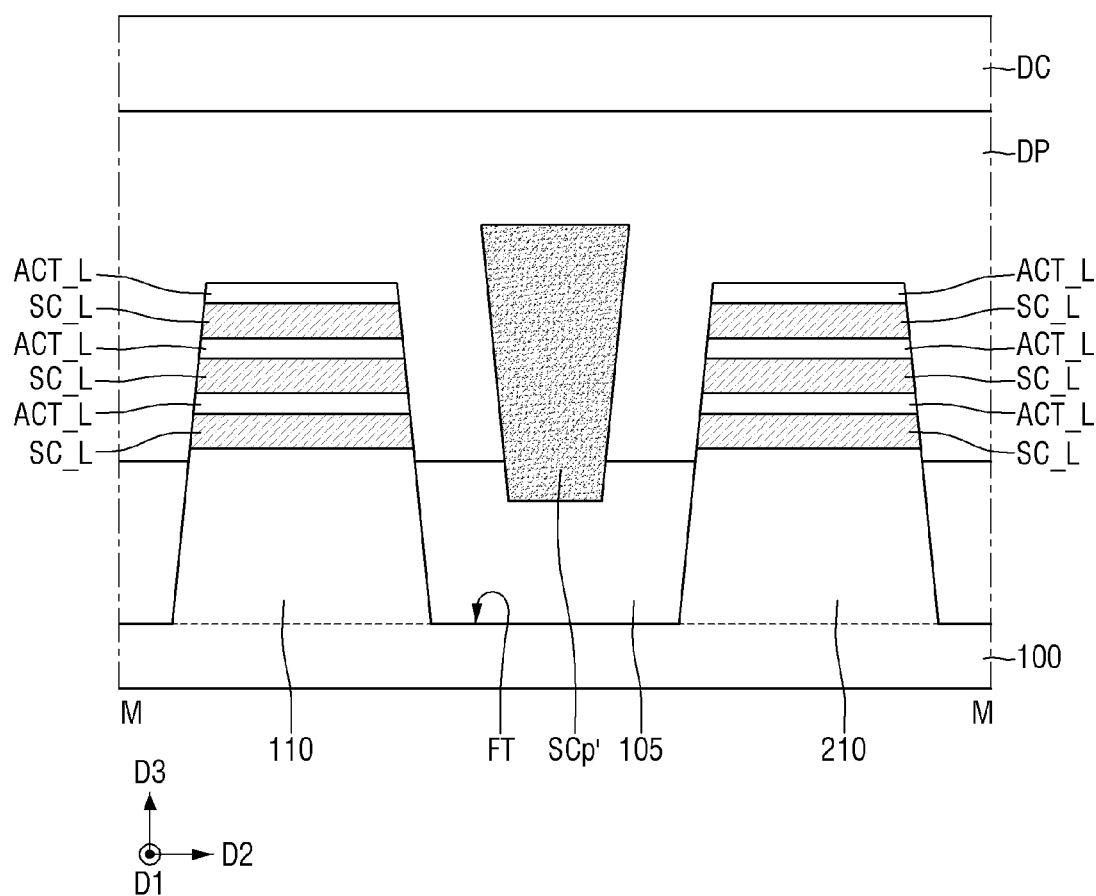
Figure 33:
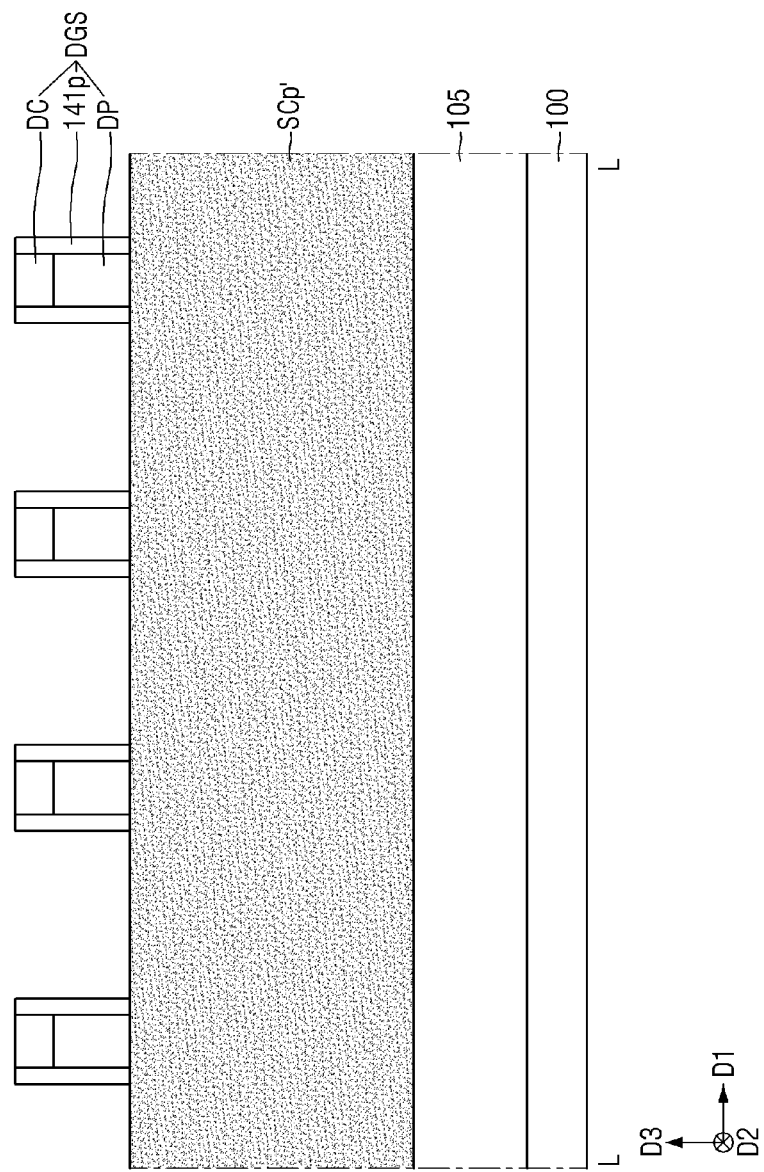
Figure 34:
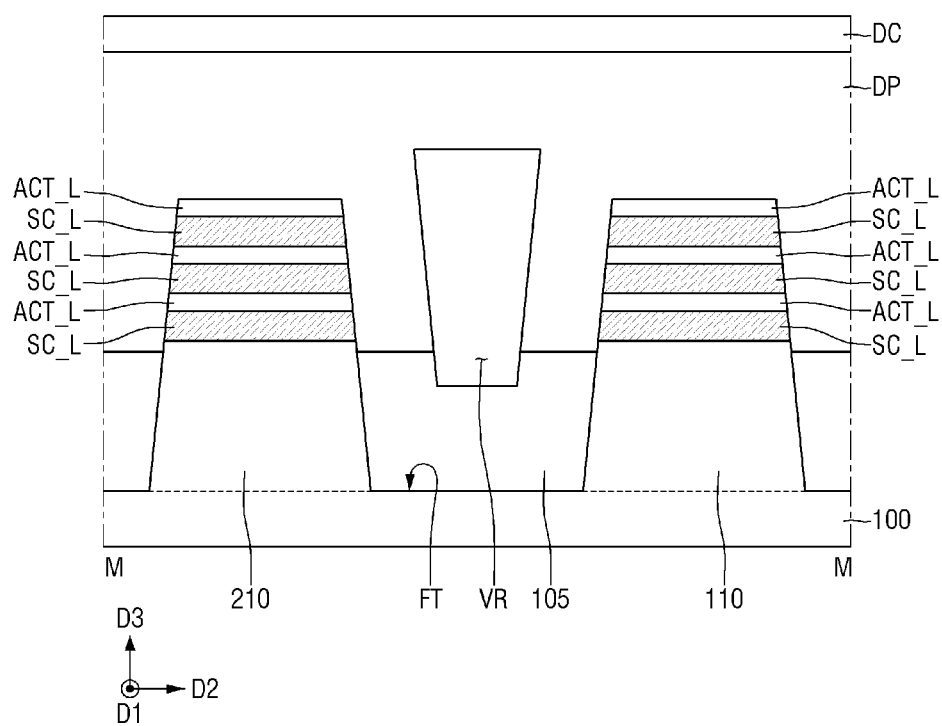
Figure 35:
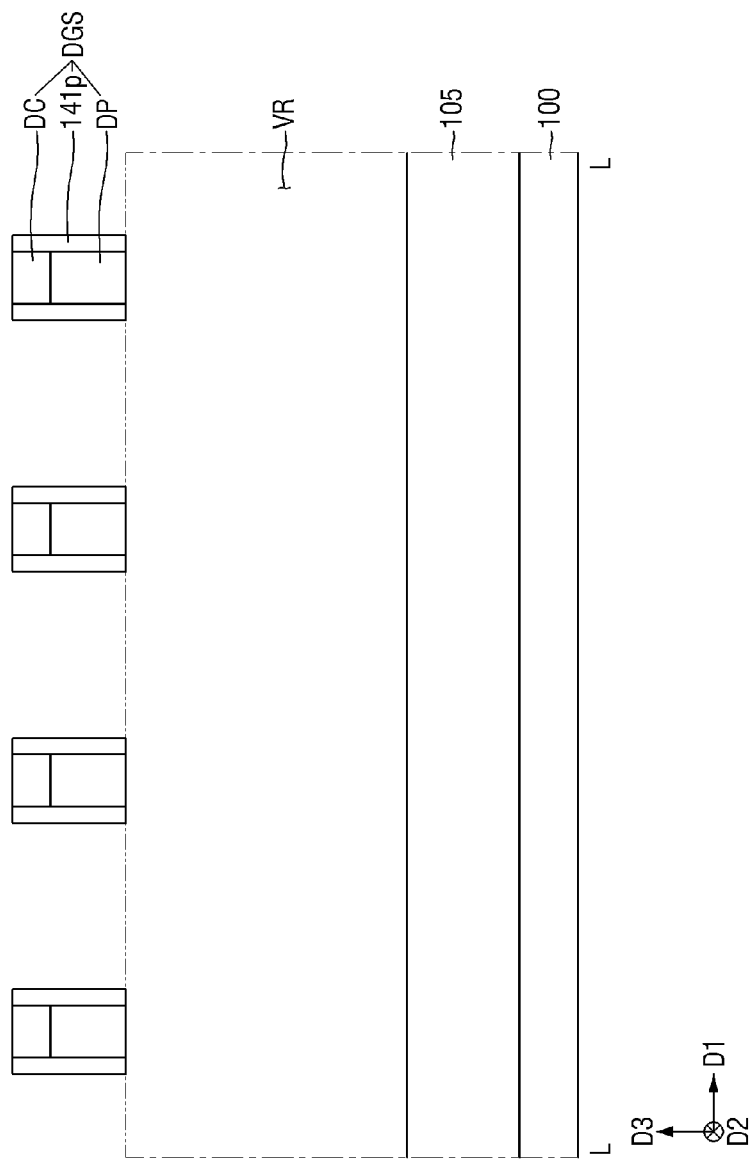
Figure 36:
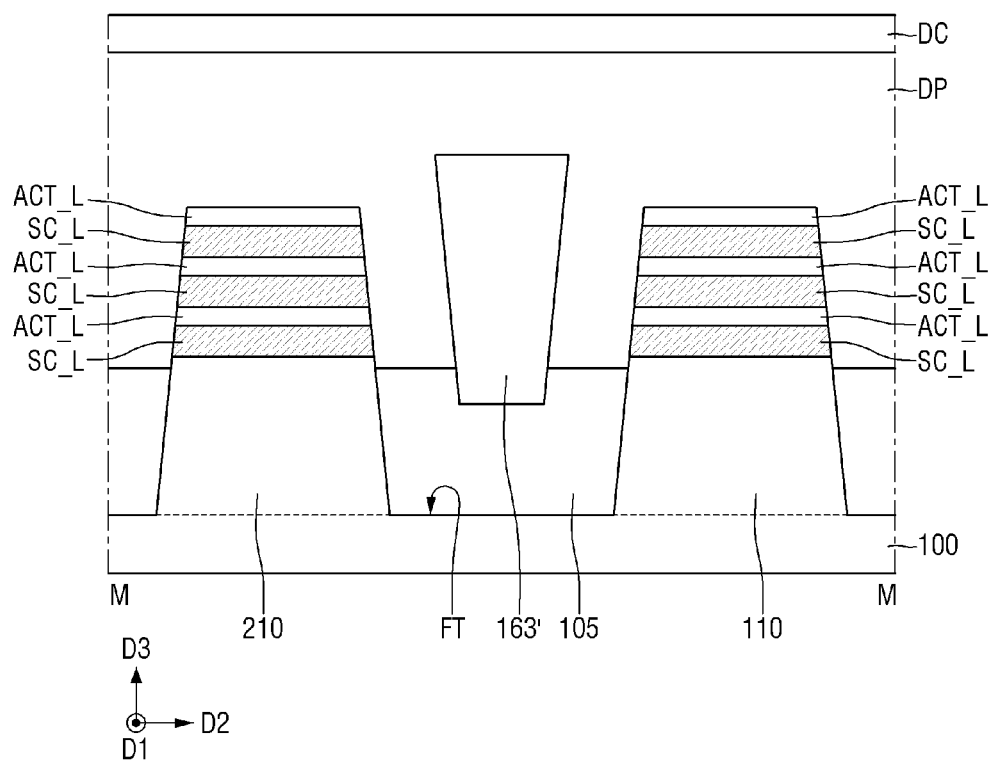
Figure 37:
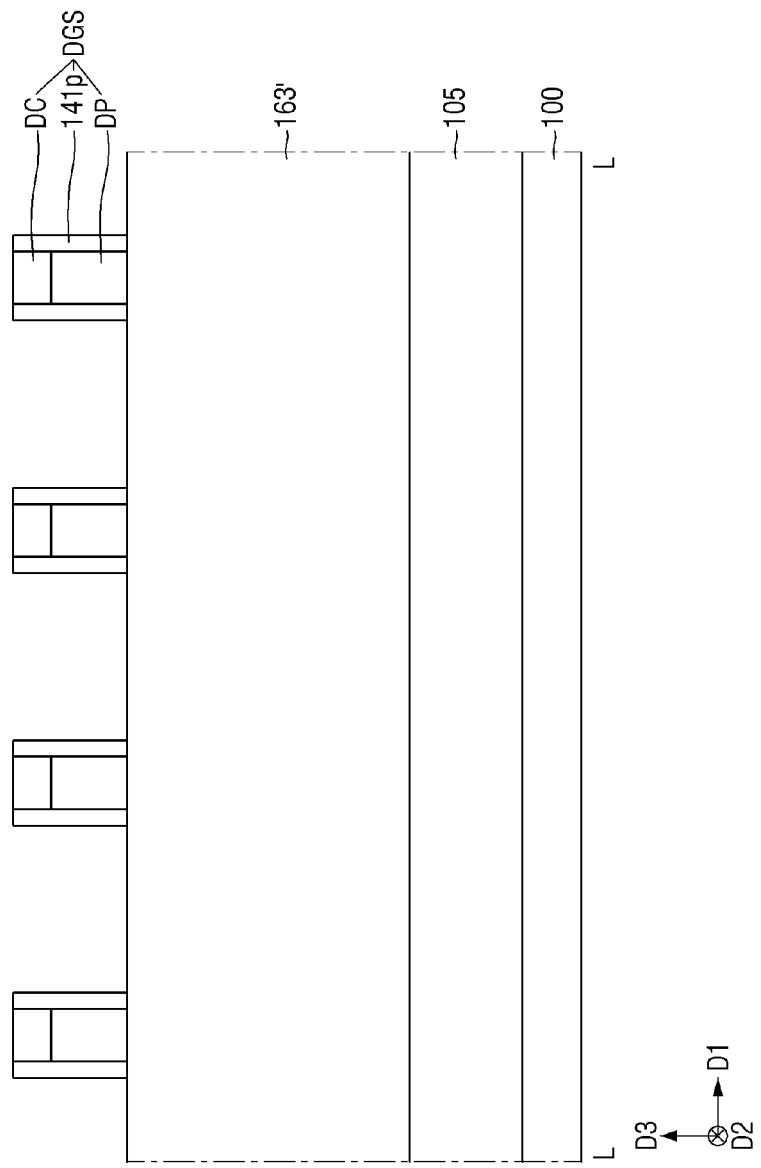

Referring to FIGS. 32 and 33, a dummy gate structure DGS may be formed on the dummy conductive material film PL' and the sacrificial film pattern SCp'.

The dummy gate structure DGS may include a dummy electrode DP, a dummy capping pattern DC, and a pre spacer 141p. The dummy electrode DP may be formed on the dummy conductive material film PL' and the sacrificial film pattern SCp', and the dummy electrode DP may include or be formed of the same material as the dummy conductive material film PL'.

The dummy capping pattern DC may act like a mask pattern, and the dummy capping pattern DC may include or be formed of, but is not limited to, for example, silicon nitride.

The pre spacer 141p may be placed on the side walls of the dummy electrode DP and the dummy capping pattern DC, and the pre spacer 141p may include or be formed of, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), and combinations thereof.

Referring to FIGS. 34 to 37, the sacrificial film pattern SCp' may be removed to form an empty space VR, and a first pre dam structure 163' may be formed in the empty space VR.

The first pre dam structure 163' may include or be formed of the same material as the first dam structure 163 in FIGS. 1 to 24. The first dam structure 163 may be formed from the first pre dam structure 163'.

Figure 38:
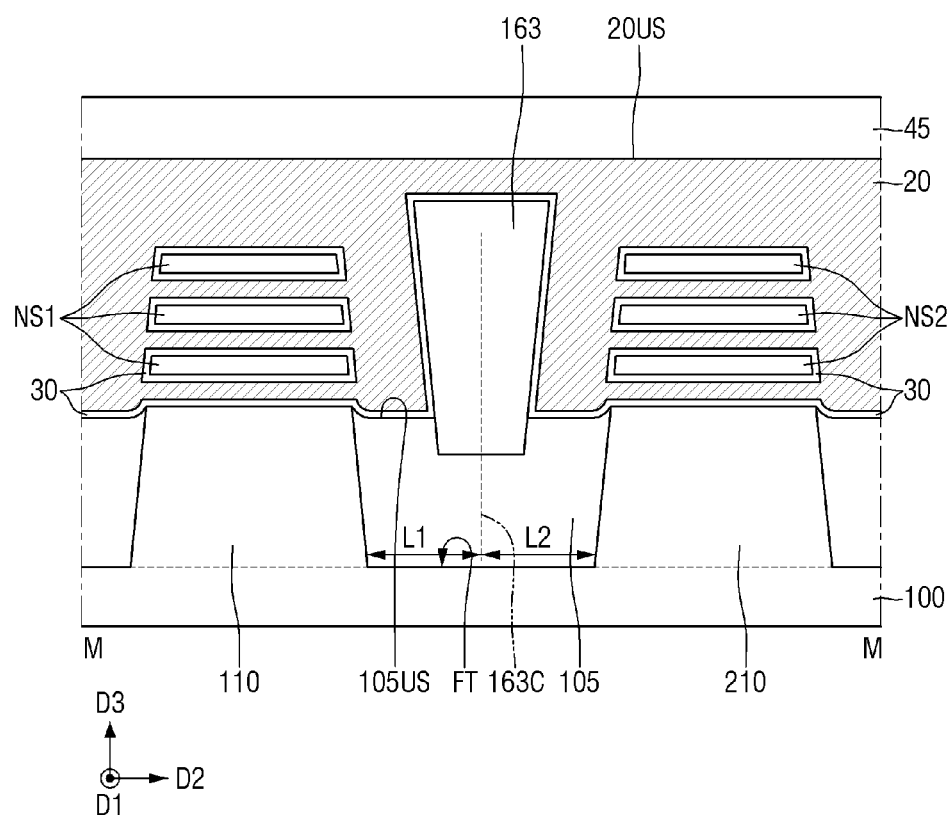

Referring to FIG. 38, the sacrificial pattern SC_L may be removed, the first sheet patterns NS1 spaced from each other in the third direction D3 may be formed on/above the first lower pattern 110, and the second sheet patterns NS2 spaced from each other in the third direction D3 may be formed on/above the second lower pattern 210.

Subsequently, the gate insulating film 30 may be formed. The gate insulating film 30 may wrap the first sheet patterns NS1 and the second sheet patterns NS2, and extend along the upper surfaces of the first and second lower patterns 110 and 210, the upper surface 105US of the field insulating film 105, and the profile of the first dam structure 163. For example, the gate insulating film 30 may be conformally formed on the upper surfaces of the first and second lower patterns 110 and 210, the upper surface 105US of the field insulating film 105, and the exposed portion of the first dam structure 163. The gate insulating film 30 may include or be formed of the same material as those of the first and second gate insulating films 130 and 230 in FIGS. 1 to 24.

Subsequently, the gate electrode 20 may be formed. The gate electrode 20 may wrap the first sheet patterns NS1 and the second sheet patterns NS2, and cover the first and second lower patterns 110 and 210, the field insulating film 105, and the first dam structure 163.

The gate electrode 20 may be subjected to or flattened by a flattening process (CMP), and the gate capping pattern 45 may be formed on the flattened gate electrode 20. The material of the gate capping pattern 45 may include or be formed of the same material as those of the first and second gate capping patterns 145 and 245 in FIGS. 1 to 24.

Figure 39:
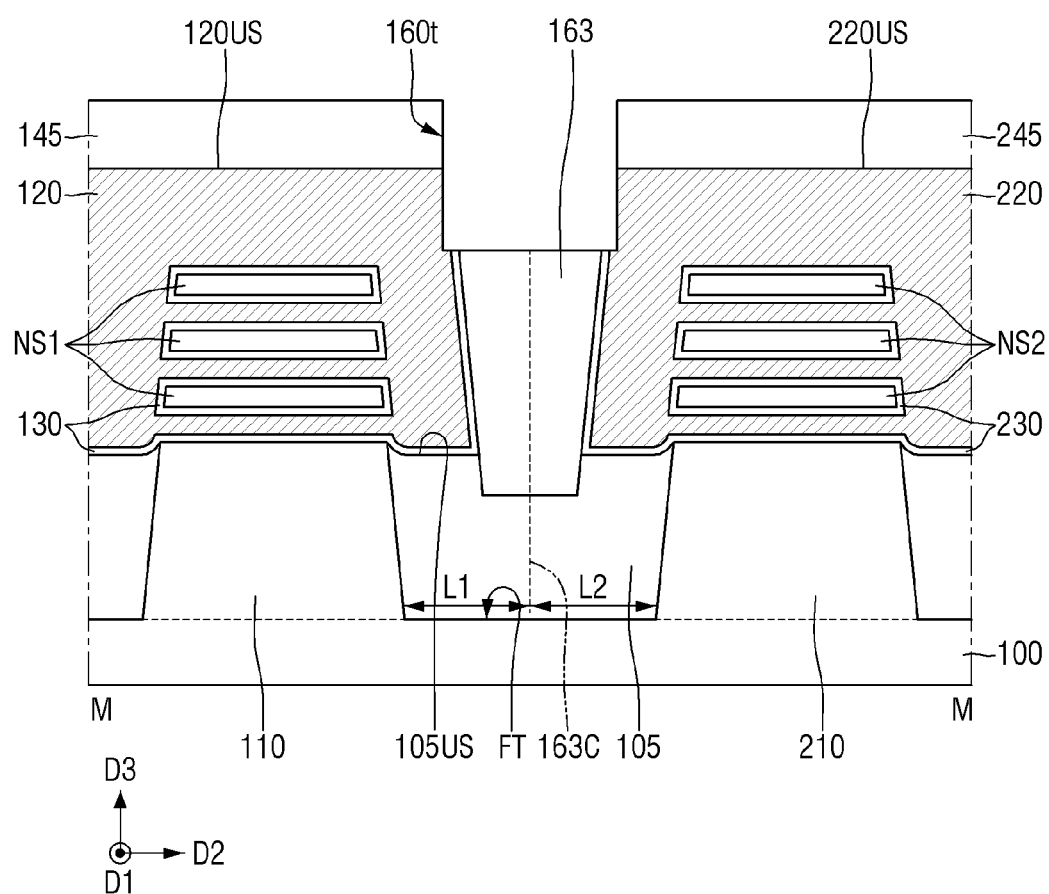

Referring to FIG. 39, the gate electrode 20, which overlaps the first dam structure 163 in a vertical direction and is placed on the upper surface of the first dam structure 163, may be removed to form the gate separation trench 160t.

The gate electrode 20 may be separated into the first gate electrode 120 and the second gate electrode 230 through the first gate separation trench 160t, and the gate insulating film 30 may be separated into the first and second gate insulating films 130 and 230, and the gate capping pattern 45 may be separated into first and second gate capping patterns 145 and 245.

Figure 40:
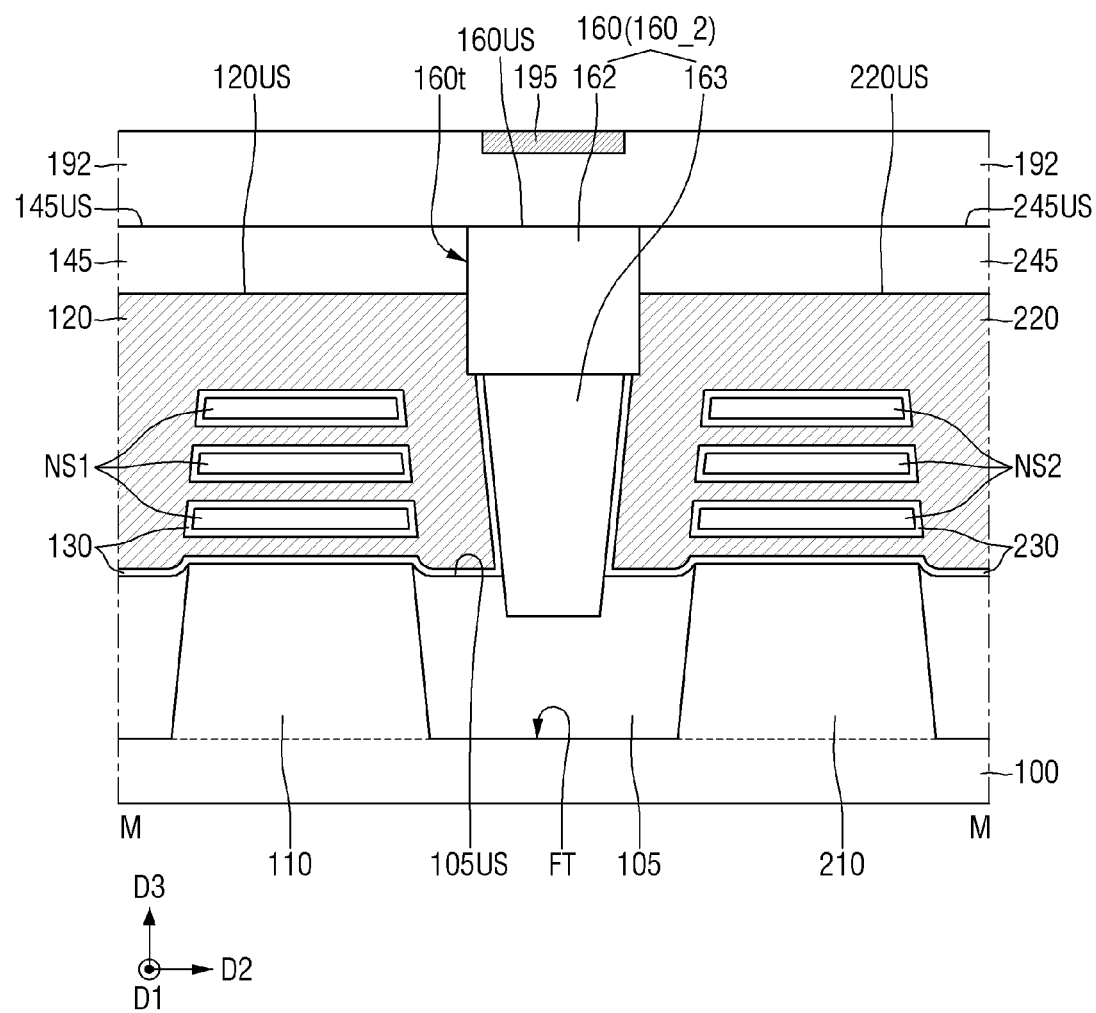

Referring to FIG. 40, the first gate separation filling film 162 may be formed along the first gate separation trench 160t, and the gate separation structure 160 may be formed.

According to the present invention, the substructure of the gate separation structure may be formed in a self-aligned manner to improve the separation operation efficiency of the gate electrode, and the width of the gate electrode placed between the active pattern and the gate separation structure may be kept constant to improve the operational reliability of semiconductor device, e.g., by the self-alignment process.

In addition, since a RMG process of cutting the gate electrode to form a final gate separation structure is performed, the upper surface of the gate electrode has the same height from the substrate 100. In particular, since the upper surface 120US of the gate electrode 120 in a region adjacent to the first gate separation structure 160 has a flat/planar shape, it is beneficial to prevent short circuit between the source/drain contact and the gate electrode and improve the reliability of semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device comprising:
   a first active pattern extending in a first direction on a substrate;
   a second active pattern which extends in the first direction and is spaced apart from the first active pattern in a second direction different from the first direction;
   a third active pattern which extends in the first direction and is spaced apart from the first active pattern in the second direction, the first active pattern being interposed between the second active pattern and the third active pattern;
   a field insulating film placed between the first active pattern and the second active pattern and between the first active pattern and the third active pattern;
   a first gate structure which crosses the first active pattern and the third active pattern, extends in the second direction, and includes a first gate electrode and a first gate insulating film, the first gate insulating film interposed between the first active pattern and the first gate electrode and between the third active pattern and the first gate electrode;
   a second gate structure which crosses the second active pattern, extends in the second direction, and includes a second gate electrode and a second gate insulating film, the second gate insulating film interposed between the second active pattern and the second gate electrode;
   a first gate separation structure placed on an upper surface of the field insulating film between the first gate structure and the second gate structure, the first gate separation structure including a first dam structure and a gate separation filling film which is at least partially placed on an upper surface of the first dam structure; and
   a second dam structure placed on an upper surface of the field insulating film between the first active pattern and the third active pattern,
   wherein the first gate insulating film extends along a side wall and an upper surface of the second dam structure, and wherein the second gate insulating film extends along a side wall of the first dam structure and does not extend along a side wall of the gate separation filling film.

2. The semiconductor device of claim 1, wherein a height of the first gate insulating film is the same as a height of the second gate insulating film from a top surface of the substrate.

3. The semiconductor device of claim 1, wherein a height of the second gate insulating film is higher than a height of the first gate insulating film from a top surface of the substrate.

4. The semiconductor device of claim 1, wherein a width of each of the first and second dam structures decreases in a direction approaching the substrate.

5. The semiconductor device of claim 4, wherein the first gate insulating film is placed between the first dam structure and the gate separation filling film.

6. The semiconductor device of claim 1, wherein a height of the first gate insulating film is between a height of the first gate electrode and a height of an uppermost surface of the first active pattern from a top surface of the substrate.

7. The semiconductor device of claim 1, wherein an upper surface of the first gate electrode closest to the gate separation structure is flat and has a constant height from a top surface of the substrate.

8. The semiconductor device of claim 1, wherein the first active pattern includes a first lower pattern, and a first sheet pattern spaced apart from the first lower pattern in a third direction which is perpendicular to the first and second directions, and the first gate electrode wraps the first sheet pattern.

9. A semiconductor device comprising:
a first active pattern extending in a first direction on a substrate;
a second active pattern which extends in the first direction and is adjacent to the first active pattern in a second direction different from the first direction;
a field insulating film placed between the first active pattern and the second active pattern;
a first gate structure which crosses the first active pattern, extends in the second direction, and includes a first gate electrode and a first gate spacer;
a second gate structure which crosses the second active pattern, extends in the second direction, and includes a second gate electrode and a second gate spacer;
a gate separation structure placed on the field insulating film between the first gate structure and the second gate structure, the gate separation structure including a wedge-shaped dam structure whose width decreases in a direction approaching the substrate and a gate separation filling film which is at least partially placed on an upper surface of the dam structure; and
a first gate insulating film which extends along at least a part of a first side wall of the gate separation structure and an upper surface of the field insulating film,
wherein a width in the second direction of the first gate electrode placed between the first active pattern and the gate separation structure at a first height from a top surface of the substrate is the same as a width in the second direction of the second gate electrode placed between the second active pattern and the gate separation structure at the first height,
a height of the first gate insulating film is between a height of the first gate electrode and a height of an uppermost surface of the first active pattern from the top surface of the substrate, and
wherein an upper surface of the gate separation structure is higher than an upper surface of the first gate electrode.

10. The semiconductor device of claim 9, wherein the first gate insulating film is placed on one side wall of the dam structure and is not placed on one side wall of the gate separation filling film.

11. The semiconductor device of claim 10, wherein the first gate insulating film is placed between the dam structure and the gate separation filling film.

12. The semiconductor device of claim 9, wherein an upper surface of the first gate electrode adjacent to the gate separation structure is flat and has a constant height from the top surface of the substrate.

13. The semiconductor device of claim 9, further comprising:
a second gate insulating film extending along at least a part of a second side wall of the gate separation structure and the upper surface of the field insulating film, the second side wall being opposite the first side wall,
wherein the first gate insulating film extends along at least a part of the first side wall of the gate separation structure and the upper surface of the field insulating film, and at least a part of the first gate insulating film is placed between the first gate electrode and the gate separation structure, and
at least a part of the second gate insulating film is placed between the second gate electrode and the gate separation structure.

14. The semiconductor device of claim 13, wherein a height of the first gate insulating film is the same as a height of the second gate insulating film from the top surface of the substrate.

* * * * *